(12) United States Patent
Shirota et al.

(10) Patent No.: US 12,648,268 B2
(45) Date of Patent: Jun. 2, 2026

(54) LIGHT-EMITTING DEVICE AND METHOD OF MANUFACTURING THE SAME

(71) Applicant: NICHIA CORPORATION, Anan (JP)

(72) Inventors: Yasuhiro Shirota, Itano-gun (JP); Ryota Mori, Itano-gun (JP); Shigeki Shimada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 576 days.

(21) Appl. No.: 17/994,386

(22) Filed: Nov. 28, 2022

(65) Prior Publication Data

US 2023/0187587 A1 Jun. 15, 2023

(30) Foreign Application Priority Data

Dec. 10, 2021 (JP) ................................. 2021-200750

(51) Int. Cl.
| | |
|---|---|
| *H10H 20/85* | (2025.01) |
| *H10H 20/01* | (2025.01) |
| *H10H 20/855* | (2025.01) |
| *H10H 20/857* | (2025.01) |
| *H10W 90/00* | (2026.01) |

(52) U.S. Cl.
CPC ........ *H10H 20/8506* (2025.01); *H10H 20/01* (2025.01); *H10H 20/855* (2025.01); *H10H 20/857* (2025.01); *H10W 90/00* (2026.01); *H10H 20/0363* (2025.01); *H10H 20/0364* (2025.01)

(58) Field of Classification Search
CPC ............. H01L 25/0753; H01L 2924/00; H01L 2224/48091; H10H 20/857; H10H 20/8506; H10H 20/855
See application file for complete search history.

(56) References Cited

U.S. PATENT DOCUMENTS

| | | | | |
|---|---|---|---|---|
| 9,119,304 B2 * | 8/2015 | Kim | ...................... | H05K 1/0295 |
| 2016/0306265 A1 | 10/2016 | Riel et al. | | |
| 2019/0049649 A1 * | 2/2019 | Hayashi | ............. | H10H 20/8511 |

(Continued)

FOREIGN PATENT DOCUMENTS

| | | |
|---|---|---|
| JP | 02-047890 | 2/1990 |
| JP | 05-031273 U | 4/1993 |
| JP | 2004-055582 | 2/2004 |

(Continued)

*Primary Examiner* — Tony Tran
(74) *Attorney, Agent, or Firm* — MORI & WARD, LLP

(57) ABSTRACT

A light-emitting device includes one or more light-emitting elements having an optical axis, a mounting substrate on which the one or more light-emitting elements are placed on a first land pattern, one or more optical elements having an optical axis, a positioning member made of metal and configured to define a relative position between the one or more optical elements and the one or more light-emitting elements such that the optical axis of the one or more optical elements and the optical axis of the one or more light-emitting elements are aligned with each other, a second land pattern formed on the mounting substrate and configured to fix one surface of the positioning member, and a bonding member configured to fix the second land pattern and the positioning member to each other. The second land pattern is divided into a plurality of regions separated by a groove portion.

12 Claims, 19 Drawing Sheets

(56)          References Cited

U.S. PATENT DOCUMENTS

2019/0311990  A1    10/2019  Oda et al.

FOREIGN PATENT DOCUMENTS

| JP | 2005-116747 | 4/2005 |
|----|-------------|--------|
| JP | 2006-258986 | 9/2006 |
| JP | 2007-220813 | 8/2007 |
| JP | 2011-154305 | 8/2011 |
| JP | 2017-523467 | 8/2017 |
| JP | 2019-071391 | 5/2019 |
| JP | 2019-192789 | 10/2019 |
| WO | WO 2016/013978 | 1/2016 |

* cited by examiner

S2301

SUBSTRATE PREPARATION STEP

S2302

SOLDER PRINTING STEP

S2303

LED/POSITIONING MEMBER
MOUNTING STEP

S2304

SOLDERING REFLOW STEP

ΔX [mm]

ΔY [mm]

● COMPARATIVE EXAMPLE 1
✕ EXAMPLE 3

PIN HEIGHT DIRECTION ACCURACY

▨ COMPARATIVE EXAMPLE 1
▨ EXAMPLE 3

ROTATIONAL DIRECTION

+ DIRECTION        − DIRECTION

COMPARATIVE EXAMPLE 1

BEFORE
REFLOW PROCESS

EXAMPLE 3

DEFAULT:(0°)

AFTER
REFLOW PROCESS

ROTATED:
(-22°)

NO ROTATION:
(0°)

LIGHT-EMITTING DEVICE AND METHOD OF MANUFACTURING THE SAME

CROSS-REFERENCE TO RELATED APPLICATION

This application is based upon and claims priority to Japanese Patent Applications No. 2021-200,750, filed on Dec. 10, 2021, the entire content of which is incorporated herein by reference.

BACKGROUND

The present disclosure relates to a light-emitting device and a method for manufacturing the light-emitting device.

A high pressure mercury lamp has been used as a conventional light source for a medium or large FPD exposure device. As a countermeasure against an environmental problem in recent years, it is necessary to deal with mercury-freedom from the viewpoint of promoting reduction of a substance harmful to the human body, and replacement of a conventional high-pressure mercury lamp with an LED (UV-LED) light source has been studied as an alternative light source.

In order to achieve an output and an irradiation shape of a known high-pressure mercury lamp by using an LED, an optical element such as a microlens array is required. Further, in order to achieve the desired performance in a light-emitting device having such a configuration, positional accuracy between an optical axis of the LED and an optical axis of the microlens array is important.

Since the LED is mounted on a mounting substrate for power supply, the positional accuracy between the LED and the microlens array is greatly affected by assembling accuracy between the mounting substrate and the microlens array.

In a conceivable method for assembling the mounting substrate and the microlens array, a mounting hole is provided in the mounting substrate and is fitted to a mounting pin provided in the microlens array.

However, when tolerances such as LED mounting accuracy of the mounting substrate, the positional accuracy of the hole, the accuracy of the hole diameter, the positional accuracy of the pin of the microlens array, and the accuracy of the pin diameter are accumulated, it is difficult to achieve the required assembling accuracy. (See JP 2019-192789 A.)

SUMMARY OF INVENTION

The present disclosure advantageously provides a light-emitting device in which positional deviation between a relative position between a light-emitting element such as an LED fixed to a mounting substrate and an optical element such as a microlens array is suppressed, and a method for manufacturing the light-emitting device.

A light-emitting device according to an embodiment of the present invention includes one or more light-emitting elements having an optical axis, a mounting substrate on which the one or more light-emitting elements are placed on a first land pattern, one or more optical elements having an optical axis and configured to emit light emitted by the one or more light-emitting elements to an outside, a positioning member made of metal and configured to define a relative position between the one or more optical elements and the one or more light-emitting elements such that the optical axis of the one or more optical elements and the optical axis of the one or more light-emitting elements are aligned with each other, a second land pattern formed on the mounting substrate and configured to fix one surface of the positioning member, and a bonding member configured to fix the second land pattern and the positioning member to each other. The second land pattern is divided into a plurality of regions separated by a groove portion.

Also, a method for manufacturing a light-emitting device according to another embodiment of the present invention is a manufacturing method for a light-emitting device including one or more light-emitting elements having an optical axis, a mounting substrate on which the one or more light-emitting elements are placed, one or more optical elements having an optical axis and configured to emit light emitted by the one or more light-emitting elements to an outside, and a positioning member made of metal and configured to define a relative position between the one or more optical elements and the one or more light-emitting elements such that the optical axis of the one or more optical elements and the optical axis of the one or more light-emitting elements are aligned with each other. This method for manufacturing a light-emitting device includes, on an upper surface of the mounting substrate, forming a first land pattern configured to mount the one or more light-emitting elements, and a second land pattern configured to fix one surface of the positioning member, the second land pattern being divided into a plurality of regions separated by a groove portion, disposing a bonding member on the first land pattern of the mounting substrate and disposing the one or more light-emitting elements on the bonding member on the first land pattern, disposing a bonding member on the second land pattern of the mounting substrate and disposing the positioning member on the bonding member on the second land pattern, and mounting the one or more light-emitting elements and the positioning member by melting the bonding member on the first land pattern and the bonding member on the second land pattern.

According to the light-emitting device of an embodiment of the present invention, the bonding member for fixing the positioning member to the mounting substrate is dispersed by the second land pattern divided into a plurality of regions, and as a result, a flow or deviation of the bonding member is suppressed and the positioning accuracy is improved.

DESCRIPTION

Figure 1:
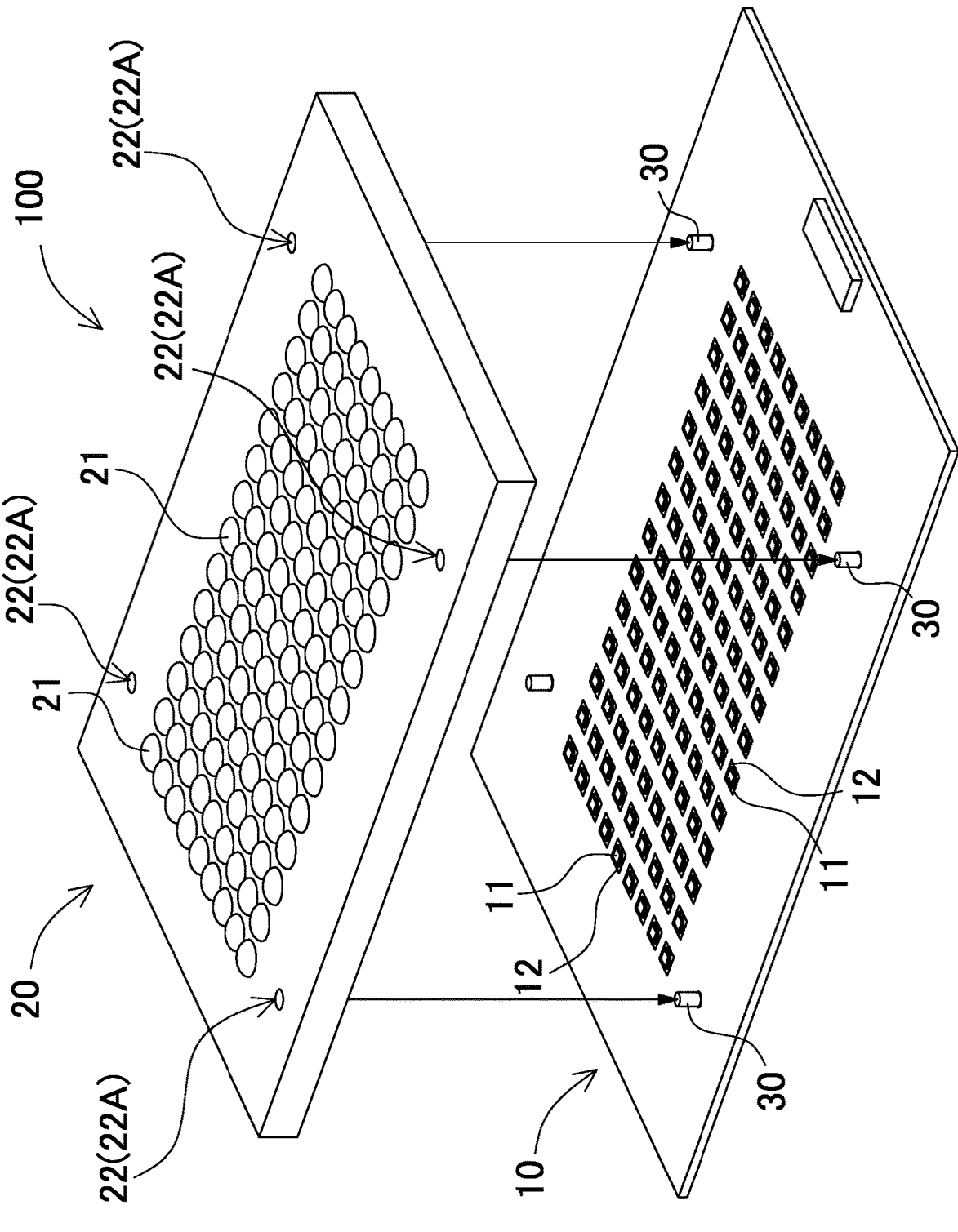
FIG. 1 is an exploded perspective view of a light-emitting device according to a first embodiment.

Embodiments of the present invention may be identified by the following configurations.

The optical element may include a positioning receiving portion corresponding to the positioning member.

The positioning receiving portion may be a hole portion into which the positioning member is inserted.

The positioning member may have a columnar shape extending for a longer distance than a diameter of a circumscribed circle of the one surface fixed to the mounting substrate.

The positioning member may have a cylindrical shape or a prismatic shape. Alternatively, the positioning member may have a conical shape or a pyramid shape.

The second land pattern may be formed in a contour corresponding to a contour of the one surface of the positioning member.

The groove portion may divide the second land pattern at a position where the groove portion passes through a center of the contour of the second land pattern.

The second land pattern may be divided such that each of the plurality of divided regions has the same area.

The second land pattern may include a region separated into an island shape at the center of the contour of the second land pattern.

The second land pattern may be divided symmetrically with respect to a point.

The second land pattern may be divided into three or more regions. According to the above configuration, a metal positioning pin for mounting a microlens array can be mounted on the mounting substrate side using a reflow process.

The one or more light-emitting elements may be a plurality of light-emitting elements.

The one or more optical elements may correspond to an optical element assembly with a plurality of optical elements.

The optical element assembly may be a microlens array in which microlenses are connected.

In the method for manufacturing a light-emitting device according to an embodiment of the present invention, the positioning member may be made of metal.

The bonding member may be cream solder.

The one or more light-emitting elements and the positioning member may be mounted by melting the bonding members in a common reflow process.

Hereinafter, the present invention will be described in more detail with reference to the drawings. In the following description, terms indicating a specific direction or position (e.g., "upper", "lower", and other terms including those terms) are used as necessary. The use of those terms, however, is to facilitate understanding of the invention with reference to the drawings, and the technical scope of the invention is not limited by the meaning of those terms. In addition, parts having the same reference numerals or signs appearing in a plurality of drawings indicate identical or equivalent parts or members.

Further, the following embodiments exemplify specific examples of the technical idea of the present invention, and the present invention is not limited to the following embodiments. In addition, unless otherwise specified, the dimensions, materials, shapes, relative arrangements, and the like of constituent elements described below are not intended to limit the scope of the present invention to those alone, but are intended to be exemplified. Further, the contents described in one embodiment and one example can be applied to another embodiment and another example. The size, positional relationship, and the like of the members illustrated in the drawings can be exaggerated in order to clarify the explanation.

Embodiments

Figure 2:
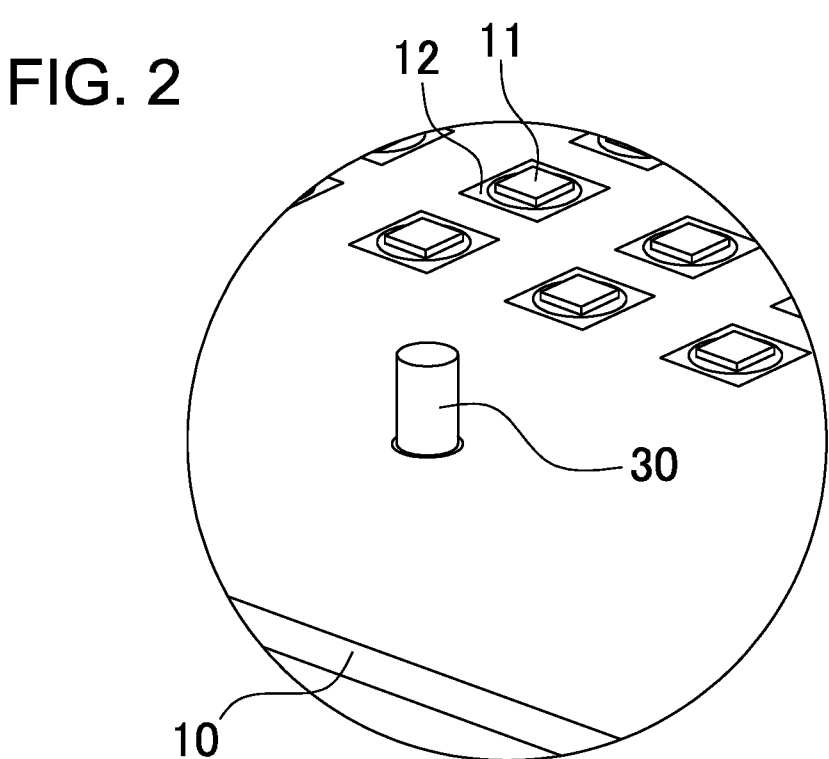
FIG. 2 is an enlarged view of a main part of the light-emitting device of FIG. 1.
Figure 3:
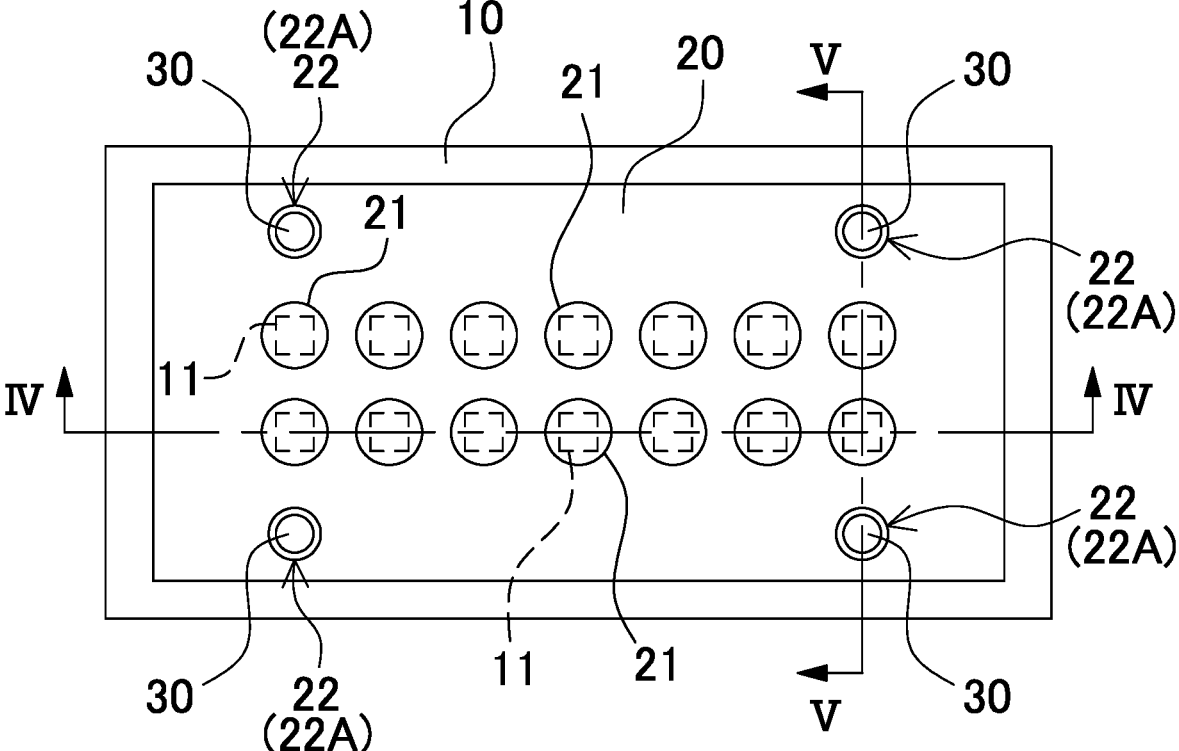
FIG. 3 is a plan view of a light-emitting device according to a second embodiment.
Figure 4:
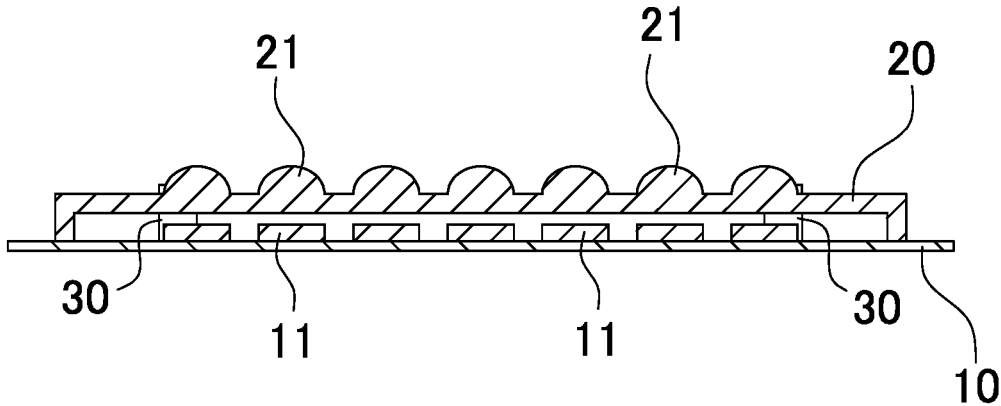
FIG. 4 is a cross-sectional view taken along line IV-IV in FIG. 3.
Figure 5:
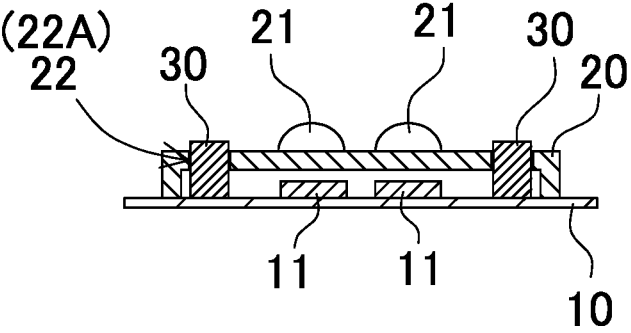
FIG. 5 is a cross-sectional view taken along line V-V in FIG. 3.
Figure 6:
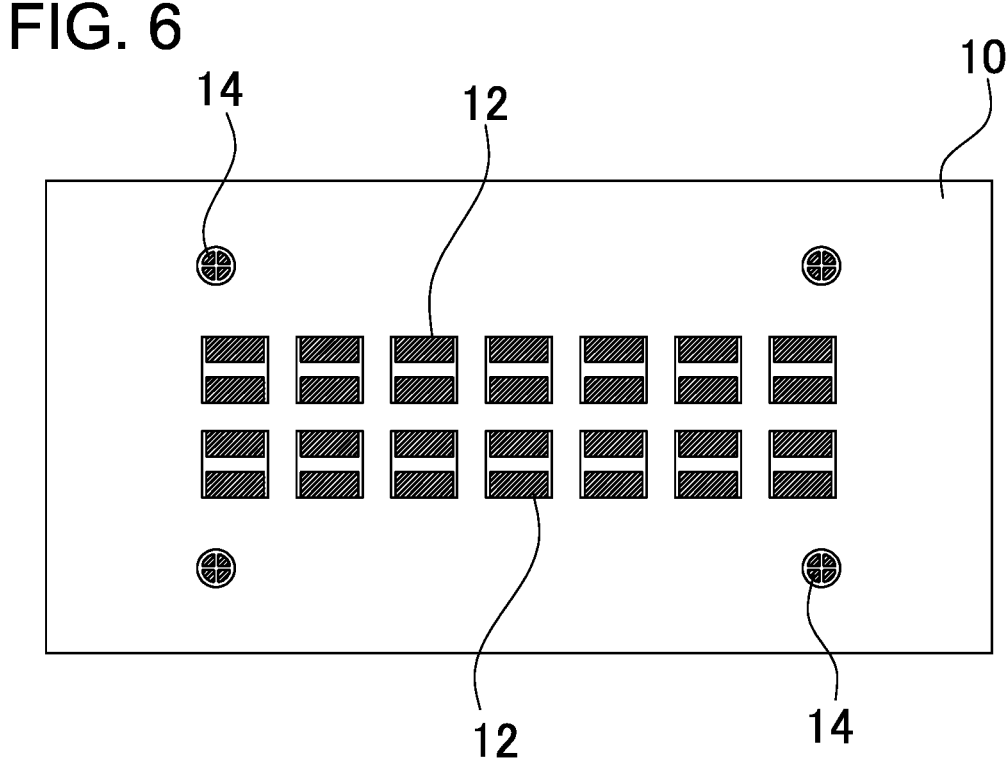
FIG. 6 is a plan view of a mounting substrate of FIG. 3.

FIG. 1 is an exploded perspective view of a light-emitting device according to a first embodiment, and FIG. 2 is an enlarged view of a main part of the light-emitting device illustrated in FIG. 1. FIG. 3 is a plan view of a light-emitting device according to a second embodiment, FIG. 4 is a cross-sectional view taken along line IV-IV in FIG. 3, FIG. 5 is a cross-sectional view taken along line V-V in FIG. 3, and FIG. 6 is a plan view of a mounting substrate of FIG. 3. The light-emitting device illustrated in these figures includes a mounting substrate 10 on which one or more light-emitting elements 11 are placed, and one or more optical elements 21.

Light-Emitting Element 11

Each light-emitting element 11 has an optical axis along which emitted light is output. In such a light-emitting element 11, a semiconductor light-emitting element such as an LED and an LD can be suitably used. As the LED, a semiconductor layered body including a light-emitting portion (hereinafter, also simply referred to as "semiconductor layered body") or a semiconductor layered body having one or more wavelength conversion layers disposed on a surface thereof can be used. The semiconductor layered body has light-emitting characteristics, and such a semiconductor layered body is produced by layering a plurality of semiconductor layers of ZnS, SiC, GaN, GaP, InN, AlN, ZnSe, GaAsP, GaAlAs, InGaN, GaAlN, AlInGaP, AlInGaN or the like on a substrate by liquid phase epitaxy, HVPE or MOCVD, and forming a light-emitting layer on any one of the semiconductor layers. By selecting a material of the semiconductor layer and an alloy ratio thereof, the emission wavelength of the light-emitting portion can be selected variously from ultraviolet light to infrared light. In particular, in a case of a display device that can be suitably used outdoors, a semiconductor layered body that can emit light with high luminance is required. Therefore, it is preferable to select a nitride semiconductor as a material of the light-emitting portion that emits green light and blue light with high luminance. For example, $In_xAl_yGa_{1-X-Y}N$ ($0 \le X \le 1$, $0 \le Y \le 1$, and $X+Y \le 1$) or the like can be used as the material of the light-emitting portion. Further, it is also possible to use an LED in which such a semiconductor layered body is combined with a wavelength conversion layer including various phosphors which are excited by light emitted from the semiconductor layered body to emit light having a wavelength different from the emission wavelength of the semiconductor layered body. When a plurality of phosphors are used, the plurality of phosphors can be disposed in one layer, or can be distributed to a plurality of layers. It is preferable to select a GaAlAs-based semiconductor or an AlInGaP-based semiconductor as the material of the semiconductor layered body that emits red light. In order to obtain a color display device, it is preferable to combine semiconductor layered bodies having emission wavelengths of red light in a range from 610 nm to 700 nm, emission wavelengths of green light in a range from 495 nm to 565 nm, and emission wavelengths of blue light in a range from 430 nm to 490 nm.

Mounting Substrate 10

As illustrated in FIGS. 1 to 5, the one or more light-emitting elements 11 are mounted on the mounting substrate 10, and the one or more optical elements 21 are fixed to an upper surface of the mounting substrate 10 in a state of being positioned via a positioning member 30. Thus, as illustrated in the plan view of FIG. 6, a first land pattern 12 for mounting the light-emitting elements 11 and a second land pattern 14 for mounting the positioning member 30 are formed on the mounting substrate 10. With such a configuration, the positioning member 30 can be mounted using a reflow process on the mounting substrate 10 side. As such a mounting substrate 10, an insulating substrate excellent in heat dissipation can be suitably used. For example, a ceramic substrate can be used, and in this example, an alumina ceramic substrate is used. Also, a glass epoxy substrate, an aluminum nitride substrate, or the like can be used as appropriate.

The first land pattern 12 is provided for each light-emitting element 11 such as an LED, and mounts and mechanically fixes the corresponding light-emitting element 11 and realizes electrical connection. Therefore, the first land pattern 12 is formed of a conductive member, and forms a part of a conductive path for electrically connecting a drive circuit and the like to the light-emitting element 11. Each first land pattern 12 is formed in a shape corresponding to a position of an electrode of the light-emitting element 11. In the example of FIG. 6, the first land pattern 12 is formed in rectangular shapes separated from each other in accordance with the positive and negative electrodes of the LED provided to be separated from each other.

Optical Element Assembly 20

As illustrated in FIGS. 3 to 5, the one or more optical elements 21 can form an assembly of the plurality of optical elements 21. Hereinafter, a member obtained by connecting the plurality of optical elements 21 is referred to as an optical element assembly 20. The optical element assembly 20 preferably has an outer shape corresponding to the outer shape of the mounting substrate 10 in a plan view. In the example of FIG. 1, the optical element assembly 20 is superimposed on the mounting substrate 10 so as to be aligned with the contour of the mounting substrate 10 in a state where a part of the rectangular mounting substrate 10 is exposed. As illustrated in FIGS. 4 and 5, the outer periphery of the optical element assembly 20 is bent into an L-shape, and the optical element assembly 20 is disposed on the mounting substrate 10 so that an end edge of the L-shaped portion is in contact with the mounting substrate 10.

The optical element assembly 20 is integrally formed in a state in which the plurality of optical elements 21 are coupled. Such an optical element assembly 20 is made of a light-transmissive resin such as acrylic resin, polycarbonate, or silicone resin.

Each optical element 21 is a member for emitting light emitted by the light-emitting element 11 to an outside. The optical element 21 refracts and diffuses the light emitted from the light-emitting element 11 or collects the light and emits the light to the outside in a predetermined light distribution pattern. Each optical element 21 has an optical axis for optically coupling with the light-emitting element 11 to output light of the light-emitting element 11 to the outside. Typically, the optical element 21 is a lens such as a convex lens or a concave lens. Also, a microlens which is a minute lens can be used. In this case, the optical element assembly 20 can utilize a microlens array in which a plurality of microlenses are connected.

Figures 7A, 7B, 7C:
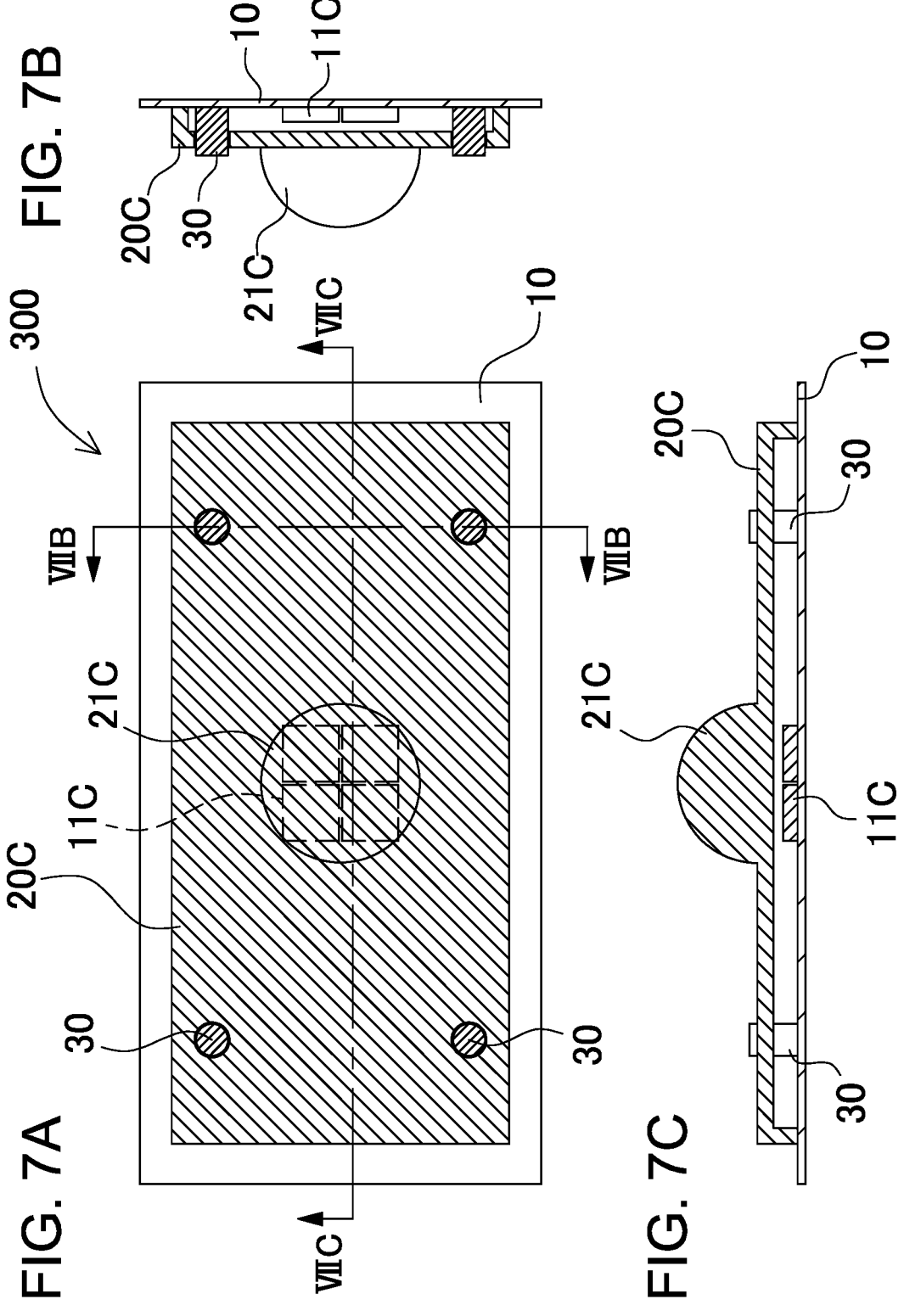
FIG. 7A is a plan view of a light-emitting device according to a third embodiment.
FIG. 7B is a cross-sectional view taken along line VIIB-VIIB in FIG. 7A.
FIG. 7C is a cross-sectional view taken along line VIIC-VIIC in FIG. 7A.

It is preferable that one optical element corresponds to one light-emitting element. When a plurality of light-emitting elements are used, as illustrated in FIGS. 1 and 3 to 5, the optical axis of each light-emitting element 11 and the optical axis of the corresponding optical element 21 are aligned with each other at a ratio of 1:1. However, one optical element may correspond to the plurality of light-emitting elements. Such an example is illustrated in FIGS. 7A to 7C as a light-emitting device 300 according to a third embodiment. In this example, four light-emitting elements 11C are disposed in a lattice shape, and one optical element 21C is disposed above the light-emitting elements 11C. In this example, an optical element assembly 20C is configured by the one optical element 21C. Alternatively, the optical element can have a plurality of optical axes, and one of the plurality of optical axes can be aligned with the optical axis of the light-emitting element.

Figures 8A, 8B, 8C:
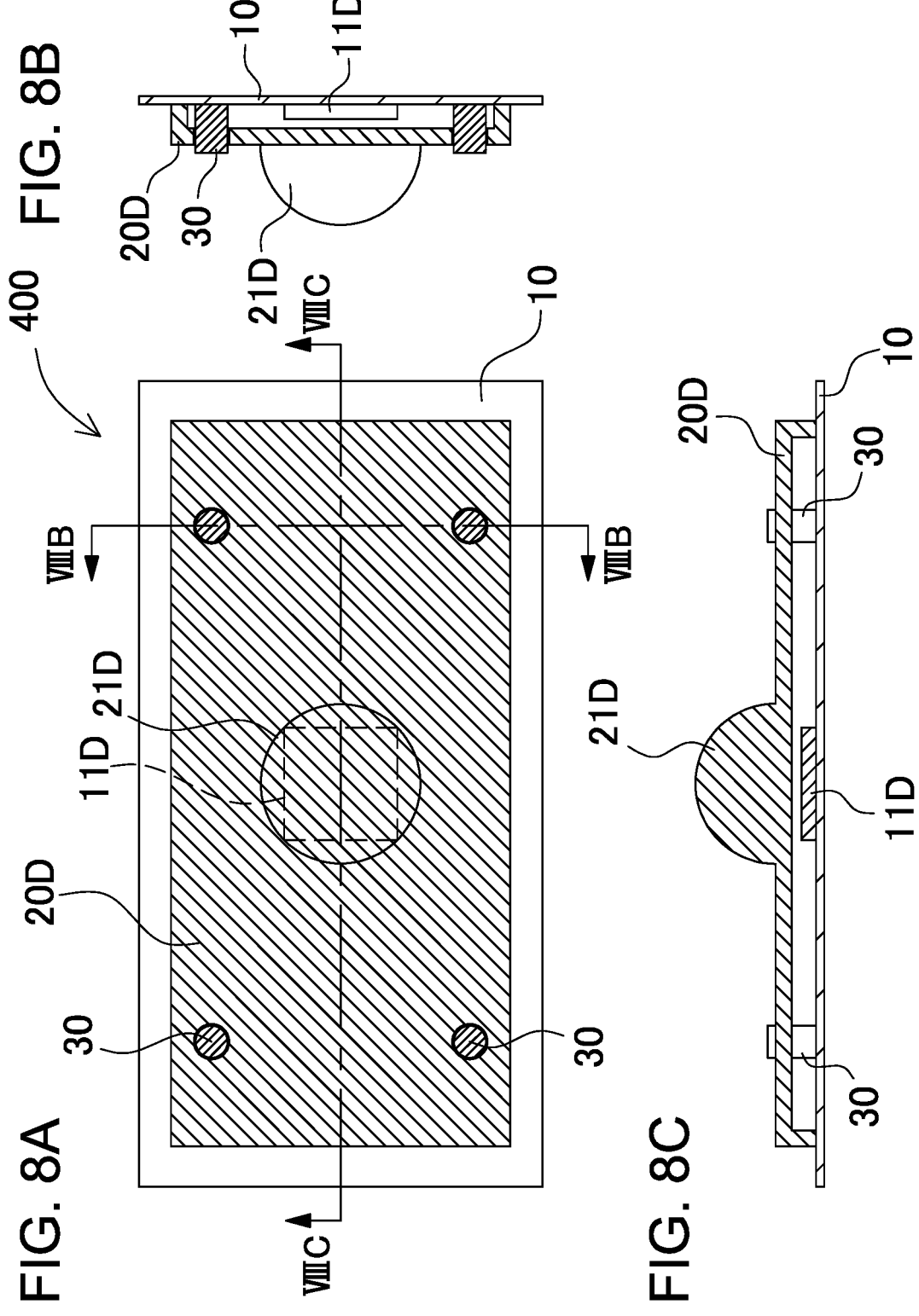
FIG. 8A is a plan view of a light-emitting device according to a fourth embodiment.
FIG. 8B is a cross-sectional view taken along line VIIIC-VIIIB in FIG. 8A.
FIG. 8C is a cross-sectional view taken along line VIIIC-VIIIC in FIG. 8A.

Alternatively, one light-emitting element and one optical element can be provided. Such an example is illustrated in FIGS. 8A to 8C as a light-emitting device 400 according to a fourth embodiment. In this example, an optical element 21D is disposed so as to include the outer shape of a light-emitting element 11D in a plan view. In this manner, an optical element assembly 20D can be configured by a single optical element 21D.

Figures 9A, 9B, 9C:
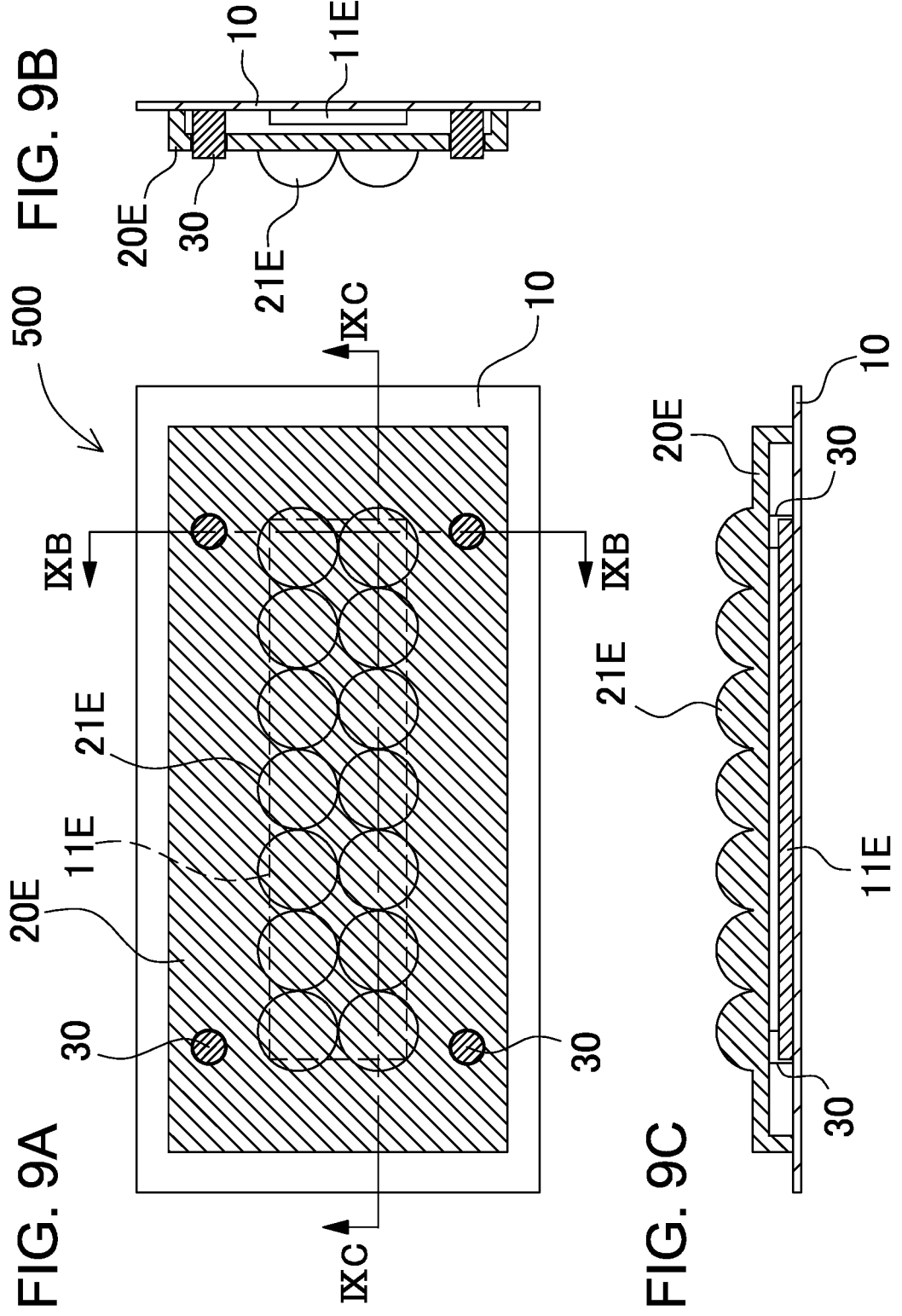
FIG. 9A is a plan view of a light-emitting device according to a fifth embodiment.
FIG. 9B is a cross-sectional view taken along line IXB-IXB in FIG. 9A.
FIG. 9C is a cross-sectional view taken along line IXC-IXC in FIG. 9A.

Alternatively, a plurality of optical elements can be provided for one light-emitting element. Such an example is illustrated in FIGS. 9A to 9C as a light-emitting device 500 according to a fifth embodiment. In this example, for a large rectangular light-emitting element 11E, a plurality of optical elements 21E, here, a total of 14 optical elements 21E of 2 rows×7 columns are provided in an optical element assembly 20E. As described above, any form can be used as a number and arrangement of the light-emitting elements and optical elements.

Figures 10A, 10B, 10C:
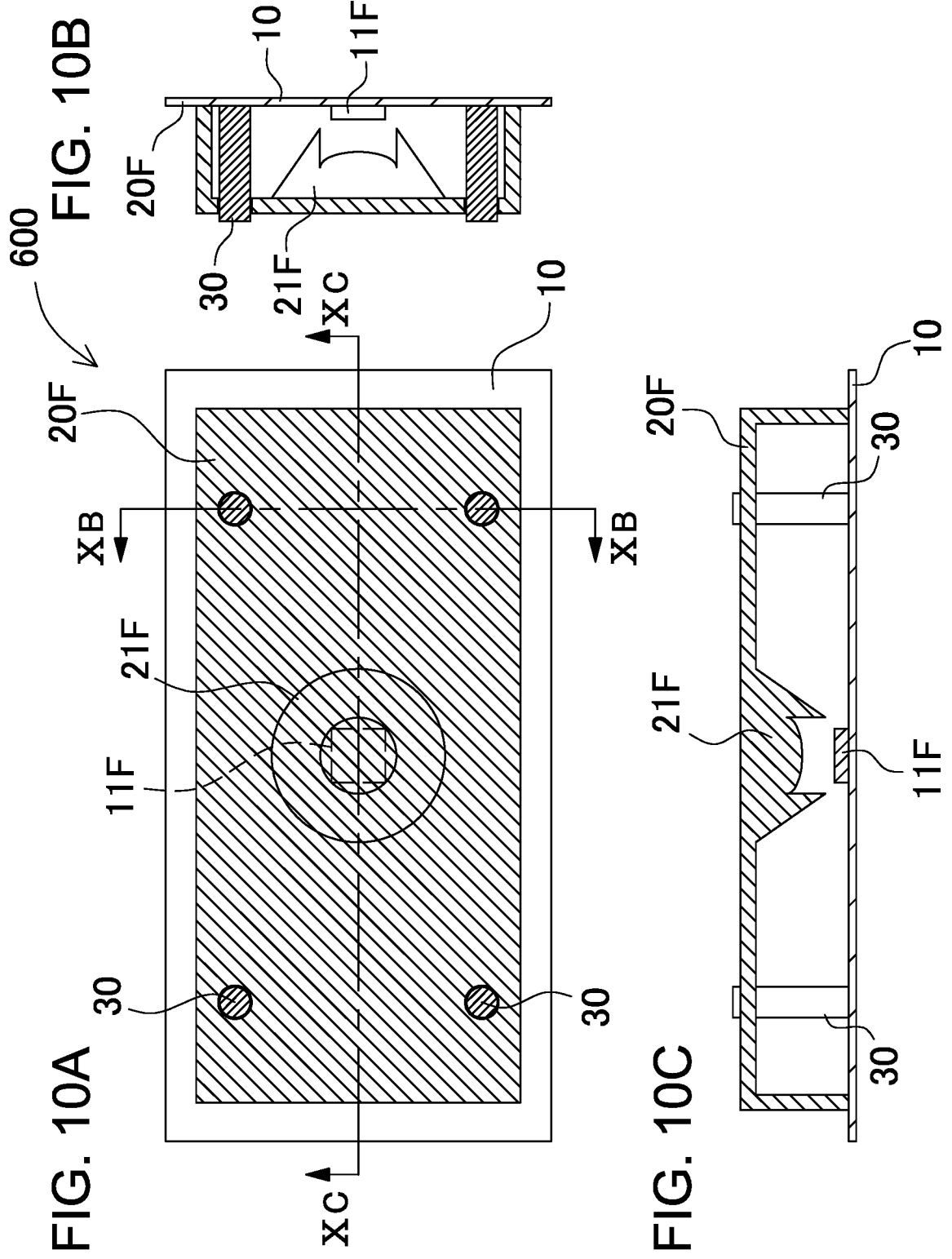
FIG. 10A is a plan view of a light-emitting device according to a sixth embodiment.
FIG. 10B is a cross-sectional view taken along line XB-XB in FIG. 10A.
FIG. 10C is a cross-sectional view taken along line XC-XC in FIG. 10A.

Further, in the above example, a dome-shaped convex lens is used as the optical element. However, as described above, the optical element is not limited to such a convex lens, and various types of optical elements can be used. As an example, a light-emitting device 600 using a lens formed so as to have a dome shape at the center and to surround the periphery in a conical shape protruding further than the dome shape is illustrated as a sixth embodiment in FIGS. 10A to 10C. The optical element 21F is a TIR lens having a shape in which both sides of a central convex lens are sandwiched by protruding right triangular shapes in a cross-sectional view, and has a function of narrowing down the range of light emitted from the light-emitting element 11F.

Figures 11A, 11B, 11C:
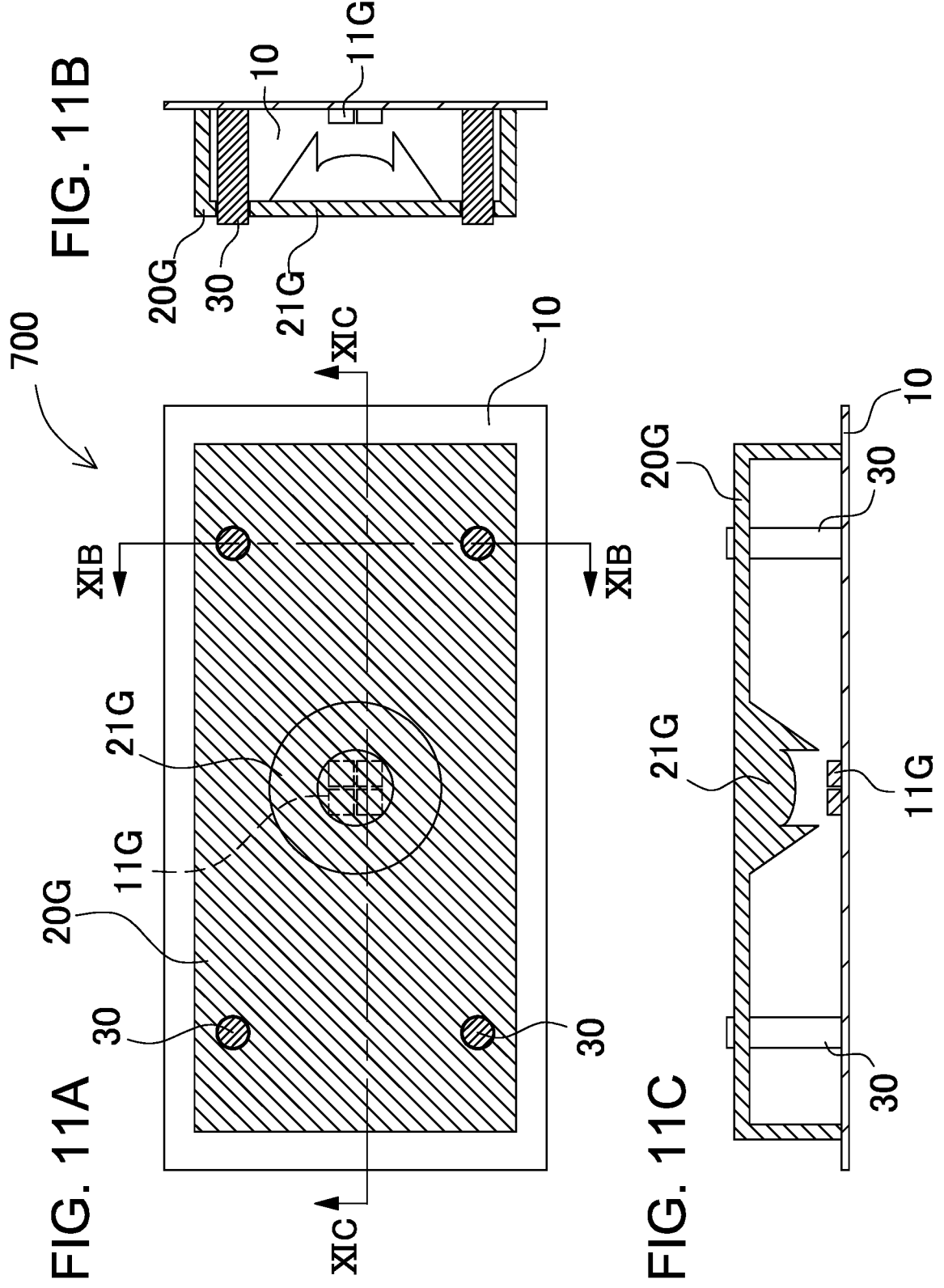
FIG. 11A is a plan view of a light-emitting device according to a seventh embodiment.
FIG. 11B is a cross-sectional view taken along line XIB-XIB in FIG. 11A.
FIG. 11C is a cross-sectional view taken along line XIC-XIC in FIG. 11A.
Figures 12A, 12B, 12C:
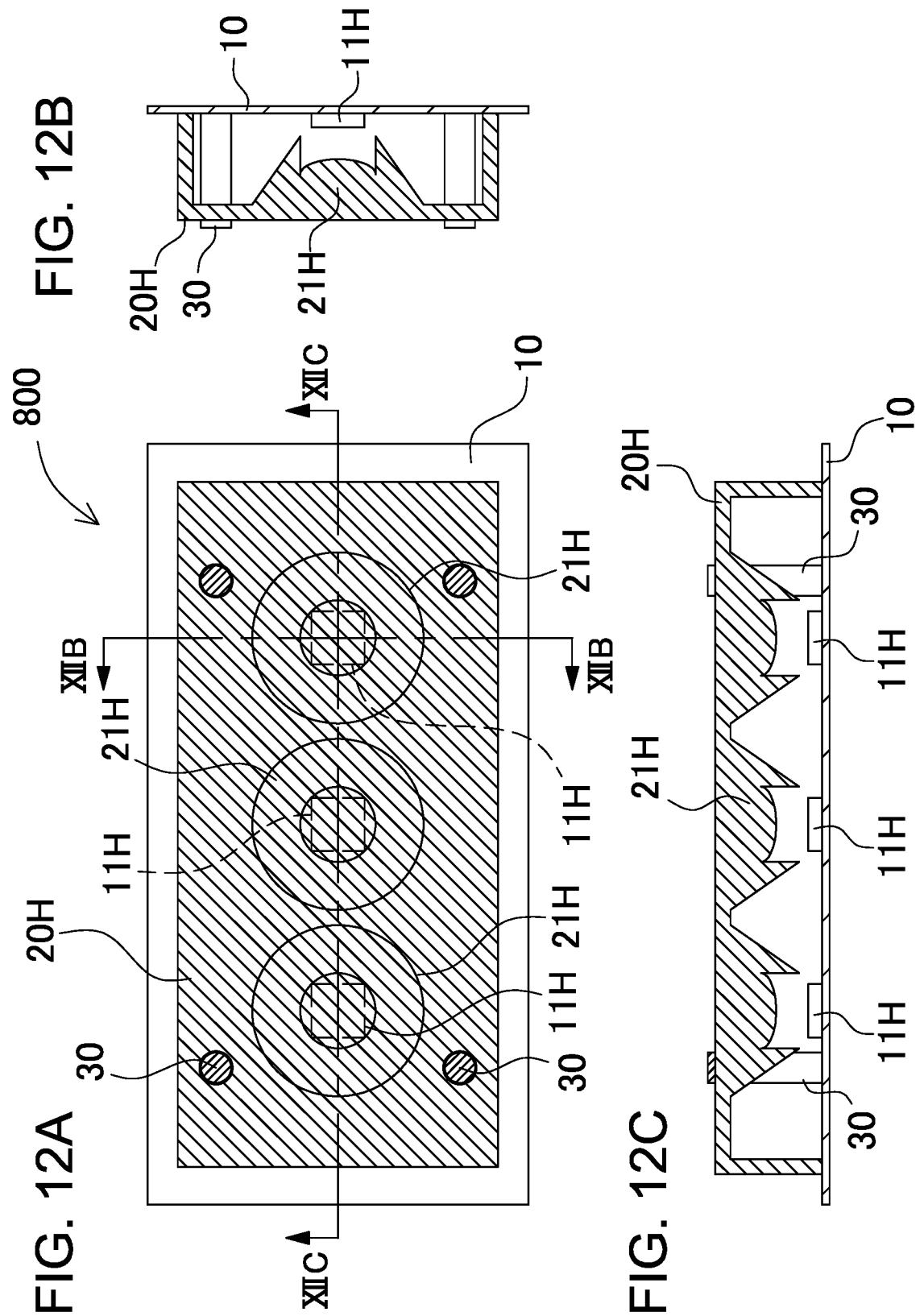
FIG. 12A is a plan view of a light-emitting device according to an eighth embodiment.
FIG. 12B is a cross-sectional view taken along line XIIB-XIIB in FIG. 12A.
FIG. 12C is a cross-sectional view taken along line XIIC-XIIC in FIG. 12A.

Needless to say, the optical element having the same or similar shape can be applied not only to the case in which one optical element is provided for one light-emitting element as in the fourth embodiment described above but also to a mode where one optical element is provided for a plurality of light-emitting elements or an aspect where a plurality of optical elements are provided for a plurality of light-emitting elements. For example, in a light-emitting device 700 according to a seventh embodiment illustrated in FIGS. 11A to 11C, an optical element assembly 20G provided with one optical element 21G is disposed on the mounting substrate 10 on which a total of four light-emitting elements 11G of 2 rows×2 columns are mounted in a grid pattern. Also, in a light-emitting device 800 according to an eighth embodiment illustrated in FIGS. 12A to 12C, an optical element assembly 20H provided with three optical elements 21H is disposed on the mounting substrate 10 on which three light-emitting elements 11H disposed side by side are mounted.

Positioning Member 30

The positioning member 30 is a member for defining a relative position of the one or more optical elements 21 and the one or more light-emitting elements 11. In the example of FIG. 1, the mounting substrate 10 on which the light-emitting elements 11 are mounted and the optical element assembly 20 provided with the optical elements 21 are positioned by the positioning member 30 so that the optical axis of each optical element 21 and the optical axis of the corresponding light-emitting element 11 are aligned with each other at a ratio of 1:1.

Positioning Receiving Portion 22

The optical element assembly 20 includes a positioning receiving portion 22 that receives the positioning member 30. The positioning receiving portion 22 is formed according to the shape and the form of the positioning member 30. In the example illustrated in FIG. 2, the positioning member 30 serves as a cylindrical positioning pin. Accordingly, the positioning receiving portion 22 formed in the optical element assembly 20 serves as a hole portion 22A into which the positioning pin is inserted. With such a configuration, the optical element assembly 20 is positioned with respect to the mounting substrate 10 by inserting the positioning pin into the hole portion 22A. Positioning members 30 are provided at four corners of the rectangular mounting substrate 10, and hole portions 22A are provided near the four corners of the optical element assembly 20 corresponding to the positioning members 30. A number of positioning members 30 and hole portions 22A is not limited to four, and can be three or less or five or more.

Each positioning member 30 preferably has a columnar shape extending for a longer distance than a diameter of a circumscribing circle of one surface fixed to the mounting substrate 10. With the elongated shape, the positioning function can be performed in a limited space. The positioning member 30 can have a cylindrical shape, a prismatic shape, a conical shape, or a pyramidal shape.

Figure 13:
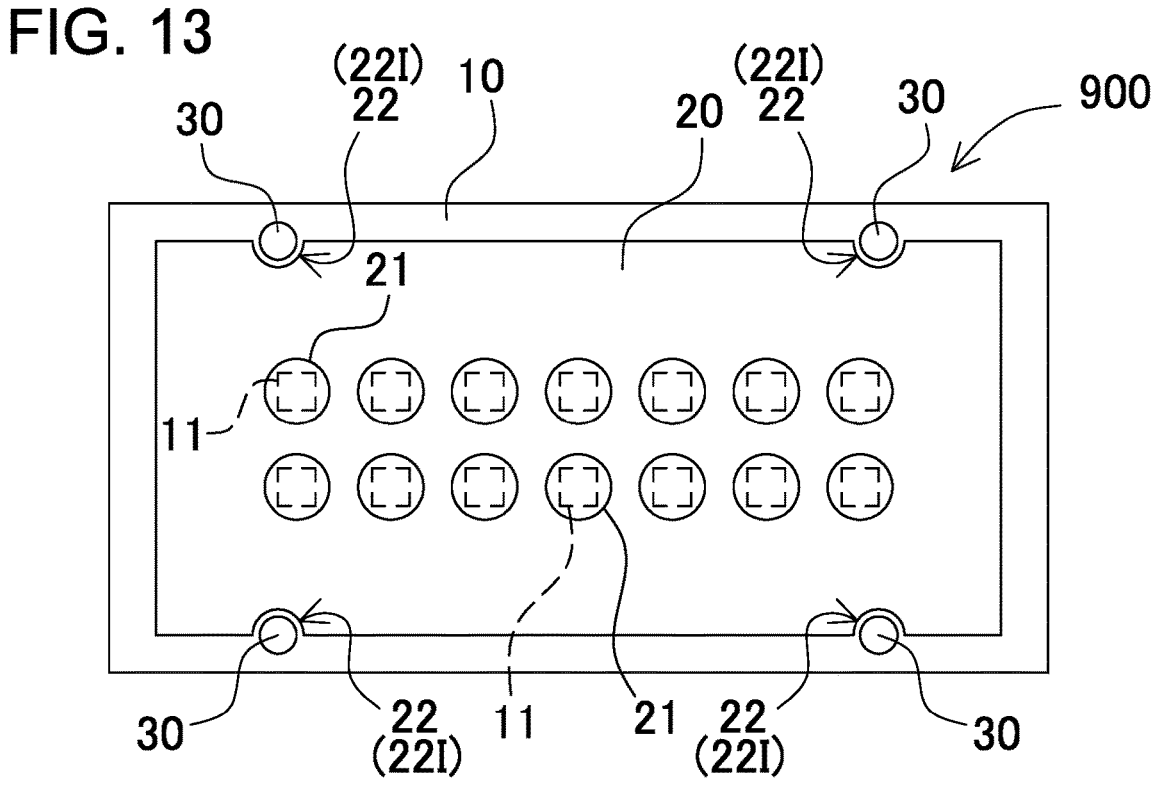
FIG. 13 is a plan view of a light-emitting device according to a ninth embodiment.

Note that the positioning member 30 and the positioning receiving portion 22 that define the relative position of the one or more optical elements 21 and the one or more light-emitting elements 11 are not limited to the combination of the positioning pin and the hole portion described above. For example, in an example of a light-emitting device according to a ninth embodiment illustrated in FIG. 13, positioning pins are used as the positioning member 30, and recesses 22I partially formed around the optical element assembly 20 are used as the positioning receiving portion 22. In this configuration, the positioning pins are fixed at positions in contact with parts of the side wall of the optical element assembly 20 in accordance with the outer shape of the optical element assembly 20. The optical element assembly 20 is provided with semi-circular recesses 22I at positions corresponding to the positioning pins in parts of the sidewall thereof.

Figure 14:
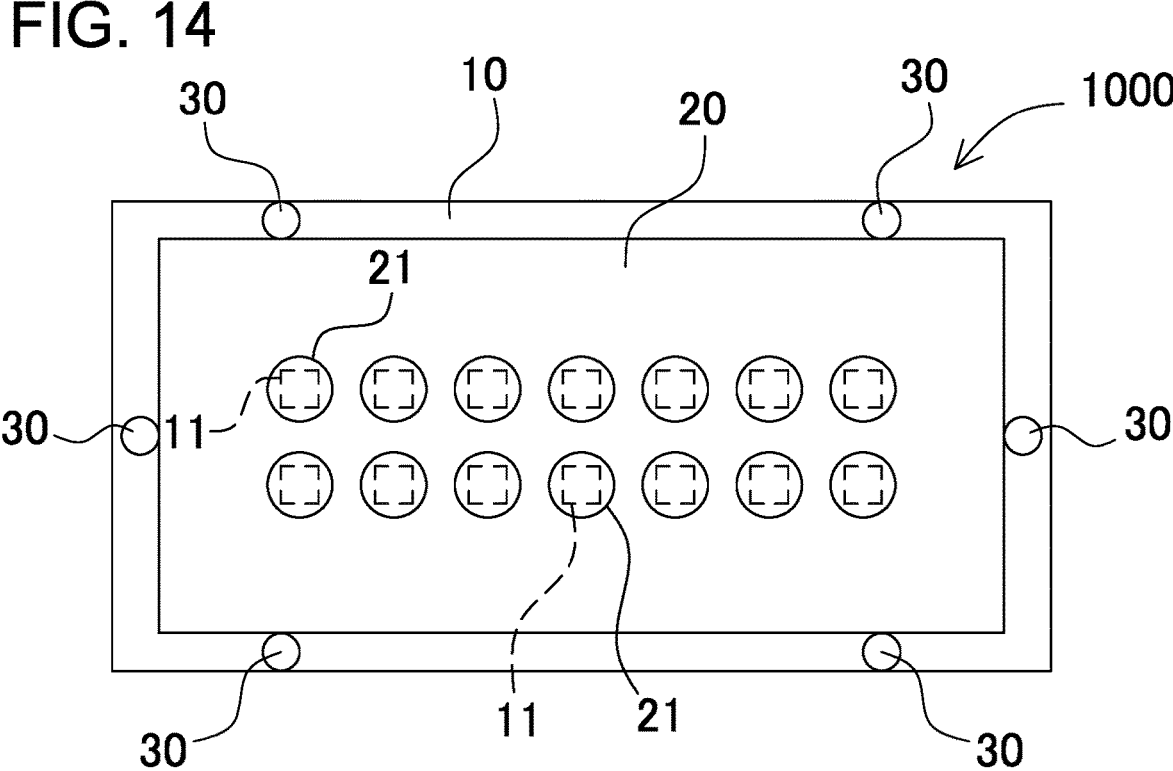
FIG. 14 is a plan view of a light-emitting device according to a tenth embodiment.

Further, it is also possible to position the optical element assembly only by the positioning member without providing the positioning receiving portion. For example, in an example of a light-emitting device 1000 according to a tenth embodiment illustrated in FIG. 14, a plurality of positioning pins are provided as the positioning member 30 along the outer periphery of the optical element assembly 20. With such a configuration, positioning is realized by disposing the positioning member 30 so as to be in contact with the outer edge of the optical element assembly 20 without providing the positioning receiving portion having a specific shape on the optical element assembly 20 side. In this case, it is conceivable that a part of the outer edge of the optical element assembly 20 functions as the positioning receiving portion.

Figure 15:
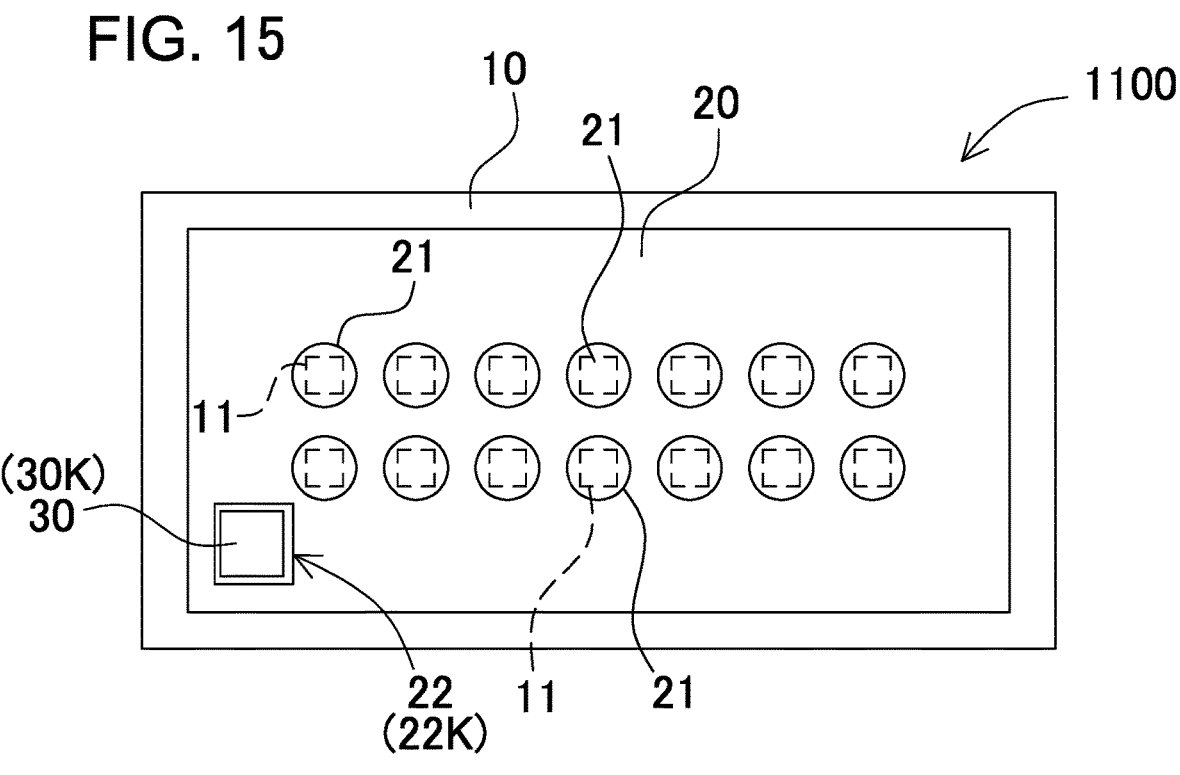
FIG. 15 is a plan view of a light-emitting device according to an eleventh embodiment.

Further, it is not necessary to provide a plurality of positioning members, and positioning can be performed by only one positioning member. Such an example is illustrated in FIG. 15 as a light-emitting device 1100 according to an eleventh embodiment. In the light-emitting device illustrated in this drawing, a rectangular column 30K is fixed to one place of the mounting substrate as the positioning member 30. Additionally, as the positioning receiving portion 22, a rectangular hole 22K having a shape similar to the outer shape of the rectangular column 30K is formed at a position of the optical element assembly 20 corresponding to the rectangular column 30K. As described above, the outer shape of the positioning member 30 is not a shape like a cylindrical pin in which the position in the rotation direction with the central axis as the rotation axis is not determined, but a shape like a prismatic shape in which the rotation angle can be defined, so that positioning can be performed even with one positioning member. Note that in the case of one positioning member, if a clearance between the rectangular column side 30K and the rectangular hole 22K is large in FIG. 15, the positional deviation can occur. Therefore, the clearance between the positioning member and the positioning receiving portion is preferably reduced. Further, it is preferable that the positioning receiving portion 22 is provided at a position closer to the inner side than the corner portion of the optical element assembly 20.

Furthermore, a screw and a nut or a tapping screw can be used as the positioning member. Further, the positioning member can have a wall-like shape and can be inserted into a slit provided in the optical element assembly as the positioning receiving portion. Alternatively, the positioning member can be formed in a shape of a stepped portion and fitted into a recess formed in the optical element assembly as the positioning receiving portion. Alternatively, when the optical element assembly is not provided with the positioning receiving portion, the positioning member can be provided as an L-shaped positioning guide which is brought into contact with the optical element assembly along the outer edge of the optical element assembly.

Figures 17, 18:
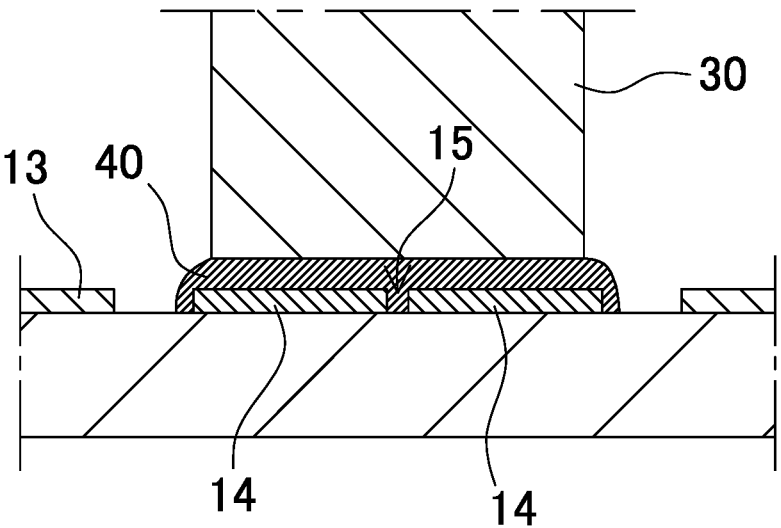
FIG. 17 is a schematic cross-sectional view of FIG. 16.
FIG. 18 is an exploded perspective view illustrating a state of fixing a positioning member to a second land pattern in a light-emitting device according to Comparative Example 1.

Each positioning member 30 is preferably made of a metal such as aluminum, copper, iron, or stainless steel when a bonding member 40 illustrated in FIG. 17 is fixed using solder or the like described later. In the example illustrated in FIGS. 1 and 2, the positioning pin is made of copper, and gold plating is applied to a nickel base.

Bonding Member 40

One surface of the positioning member 30 is fixed to the second land pattern 14 of the mounting substrate 10. The second land pattern 14 is a metal film such as a copper foil, and is patterned on the mounting surface of the mounting substrate 10 together with the first land pattern 12. As the bonding member 40 for fixing the positioning member 30 to the second land pattern 14, a material having good wettability with respect to the second land pattern 14 and the positioning member 30, for example, solder or the like can be used. In particular, cream solder suitable for reflow is preferred.

Second Land Pattern 14

Figure 16:
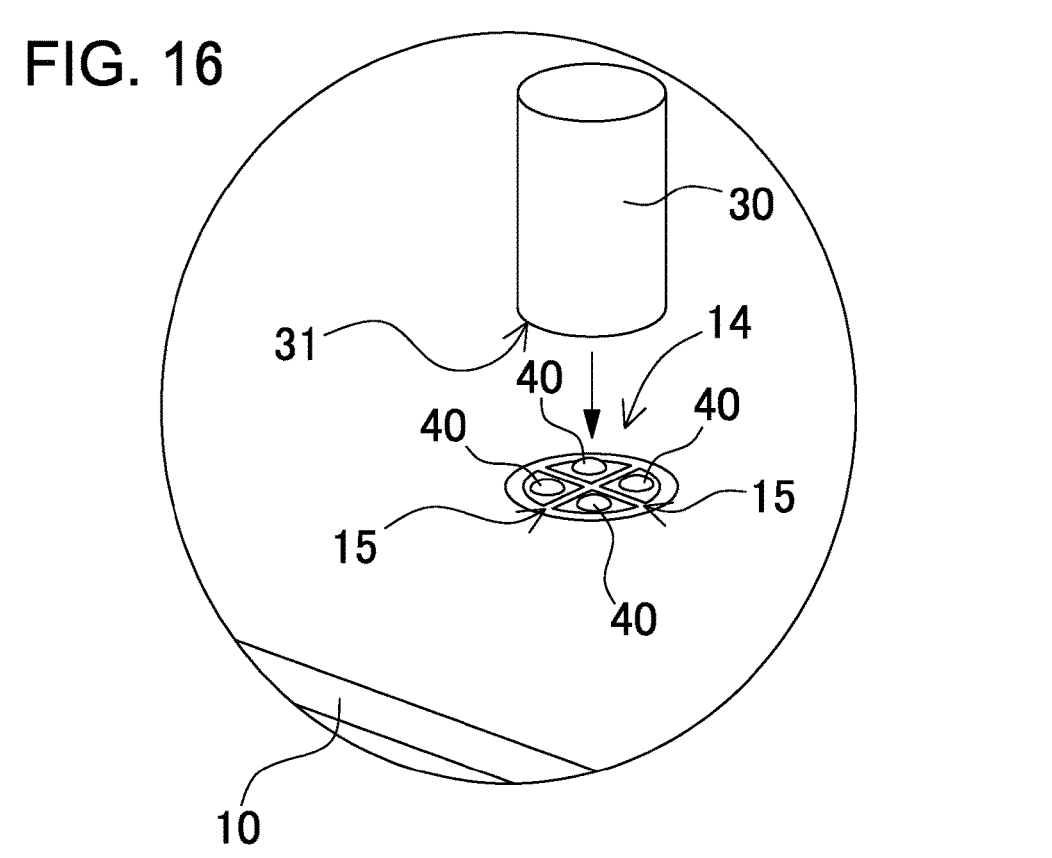
FIG. 16 is an exploded perspective view illustrating a state of fixing a positioning member to a second land pattern in the light-emitting device according to the first embodiment.

The second land pattern 14 is divided into a plurality of regions separated by a groove portion 15 as illustrated in the exploded perspective view of FIG. 16 and the schematic cross-sectional view of FIG. 17. In a region where the groove portion 15 is provided, a metal film constituting the second land pattern 14 does not exist, and a surface of the mounting substrate 10 is exposed. Thus, the bonding member 40 applied on the second land pattern 14 does not exist in the portion of the groove portion 15. With such a configuration, the bonding member 40 such as solder for fixing the positioning member 30 to the mounting substrate 10 is dispersed by the second land pattern 14 divided into a plurality of regions, and as a result, the flow or deviation of the bonding member 40 is suppressed and the positioning accuracy is improved.

Figure 19:
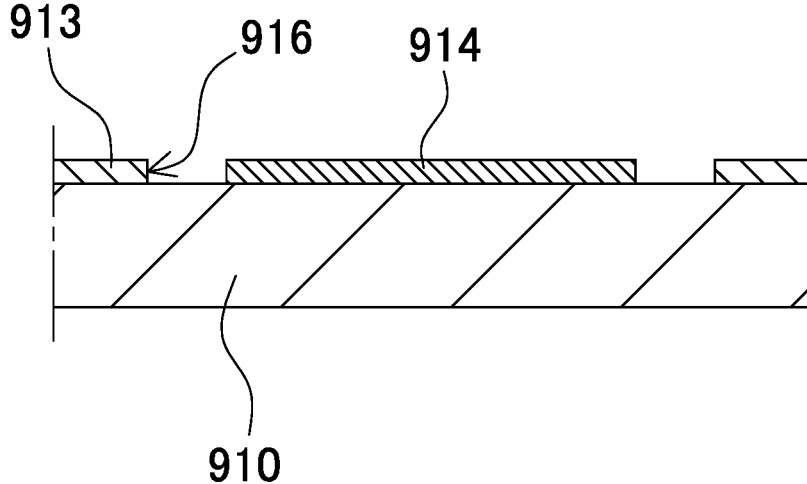
FIG. 19 is a schematic cross-sectional view illustrating the second land pattern in FIG. 18.
Figure 20:
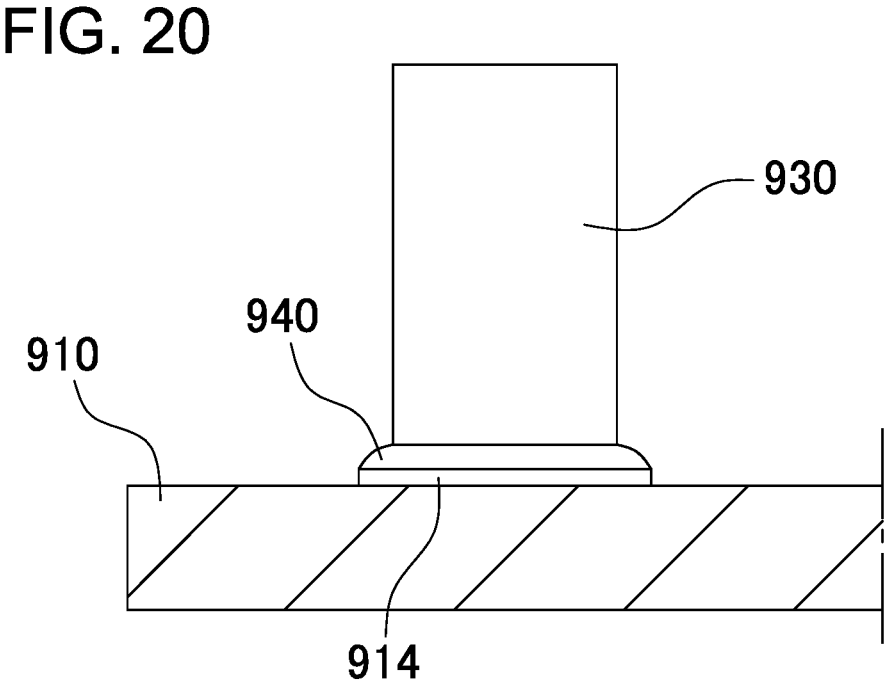
FIG. 20 is a schematic cross-sectional view illustrating an ideal state of fixing the positioning member in the second land pattern in FIG. 19.

To position the optical element assembly such as a microlens array on the mounting substrate in the configuration using the positioning pin and the hole portion, as illustrated in the exploded perspective view of FIG. 18 and the schematic cross-sectional view of FIG. 19, it is conceivable that a resist pattern 913 provided with a circular opening 916 is formed on a mounting substrate 910, a circular second land pattern 914 slightly smaller than the opening 916 is formed to be separated from the opening 916 of the resist pattern 913, and a positioning pin 930 is fixed by solder 940. Such fixing using the solder 940 is performed in the same process as that of mounting the light-emitting element such as an LED on the mounting substrate 910, thereby improving the efficiency of the manufacturing process. For example, there is a reflow process in which the positioning pin 930 is disposed in solder paste and they are flowed in a reflow furnace to melt the solder 940. Thus, ideally, as illustrated in the schematic cross-sectional view of FIG. 20, the positioning pin 930 can be fixed in a vertical posture on the mounting substrate 910 via the solder 940.

Figure 21:
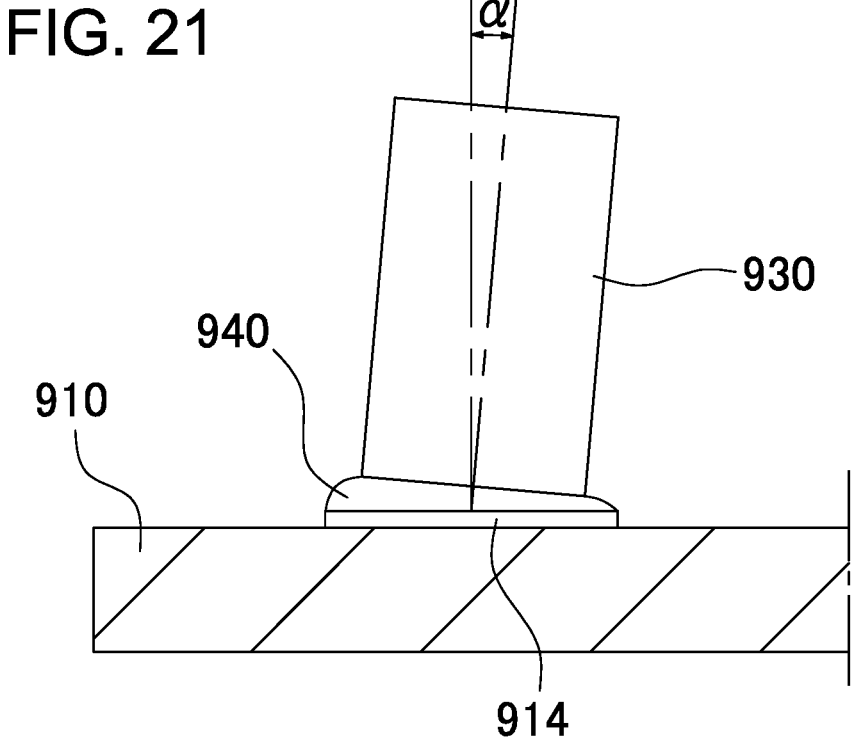
FIG. 21 is a schematic cross-sectional view illustrating a state in which the positioning member is inclined and fixed in the second land pattern in FIG. 19.

However, in an actual manufacturing process, the solder 940 applied to the second land pattern 914 may flow and the thickness may become uneven. In particular, the present inventors have found that the solder 940 is concentrated on one side of the second land pattern 914, and as a result, as illustrated in the schematic cross-sectional view of FIG. 21, the positioning pin 930 may be fixed in an inclined posture at an angle α, and when the solder 940 is in a dome shape in a molten state, the positioning pin 930 is solidified in a biased state due to surface tension, thereby deteriorating the positional accuracy. When the positioning pin 930 is fixed in the inclined posture as described above, the optical element assembly connected by inserting the positioning pin 930 is fixed in a state of being positionally deviated, and a situation may occur in which performance as originally designed is not exhibited due to displacement of the optical axis between the optical element and the light-emitting element. In particular, as the positioning pin 930 becomes longer in the vertical direction, the influence of the positional deviation due to the inclination becomes larger.

Therefore, in the present embodiment, a configuration is employed in which the second land pattern 14 is divided into a plurality of regions as illustrated in FIG. 16. With such a configuration, the inclination of the positioning member 30 in the axial direction is suppressed, which has been found by the test of the present inventors. The reason for this suppression is presumed to be that the bonding member 40 such as solder is more uniformly dispersed by reducing the area to which the bonding member 40 is individually applied, and that as illustrated in the schematic cross-sectional view of FIG. 17, when the bonding member 40 is pressed by the positioning member 30, an excess portion of the bonding member 40 is pushed out to the groove portion 15, thereby suppressing a situation in which the bonding member 40 is partially raised. In addition, the positional deviation and rotation of the positioning member 30 in the horizontal direction are also suppressed. In addition, displacement of the positioning member 30 in the height direction is also suppressed.

The second land pattern 14 is preferably formed in a contour corresponding to the contour of the one surface of the positioning member 30. For example, when a bonding surface 31 of the positioning member 30 is circular as illustrated in the exploded perspective view of FIG. 16, the contour of the outer shape of the second land pattern 14 is also circular. In addition, in a case in which the bonding surface 31 of the positioning member 30 has a polygonal shape, the contour of the outer shape of the second land pattern 14 is also a polygonal shape.

Further, it is preferable that the groove portion 15 dividing the second land pattern 14 into a plurality of regions be provided at a position where the groove portion 15 passes through the center of the contour of the second land pattern 14. This makes it possible to uniformly disperse the second land pattern 14.

Figure 22:
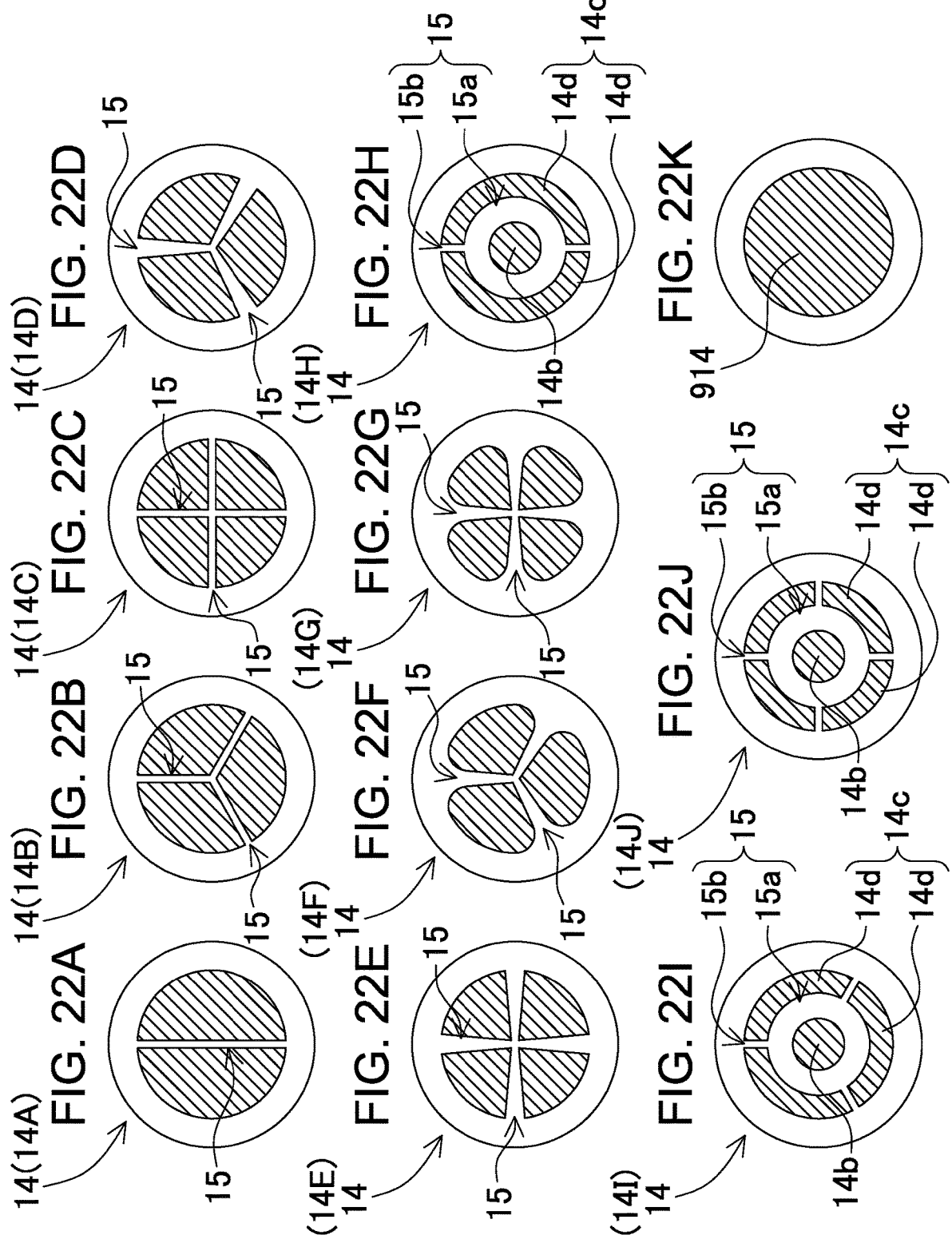
FIGS. 22A to 22J are plan views illustrating a second land pattern of a light-emitting device according to Examples 1 to 10.
FIG. 22K is a plan view illustrating a second land pattern of the light-emitting device according to Comparative Example 1.

Examples of the second land pattern 14 are now illustrated in FIGS. 22A to 22K. FIGS. 22A to 22J illustrate the second land pattern 14 of a light-emitting device according to Examples 1 to 10, and FIG. 22K illustrates the second land pattern 914 of a light-emitting device according to Comparative Example 1. To be more specific, a second land pattern 14A of the light-emitting device according to Example 1 illustrated in FIG. 22A is divided into two regions, second land patterns 14B, 14D, and 14F of the light-emitting device according to Examples 2, 4, 6 illustrated in FIGS. 22B, 22D, and 22F are divided into three regions, and second land patterns 14C, 14E, and 14G of the light-emitting device according to Examples 3, 5, 7 illustrated in FIG. 22C, FIG. 22E, and FIG. 22G are divided into four regions. As the number of divisions increases, the bonding member 40 can be more uniformly dispersed. Meanwhile, the second land pattern 14 becomes complicated. Preferably, the second land pattern 14 is divided into three or more regions.

Additionally, as illustrated in FIGS. 22A to 22C, the groove portion 15 dividing the second land pattern 14 can be formed in a line shape having an equal width or can be formed in a line shape having a different width. For example, in the second land pattern 14 of Examples 4 to 7 illustrated in FIGS. 22D to 22G, the second land pattern 14 is divided by a groove portion 15 which becomes narrower toward the center of the second land pattern 14. The divided second land pattern 14 can also face the corner as in Examples 6, 7 illustrated in FIGS. 22F and 22G. As a result, the width of the groove portion 15 is increased, thereby obtaining an effect of reducing voids in the solder. Furthermore, the second land pattern 14 after division is smaller than that of the case in which the groove portion is equal, and thus the flow suppression effect of the solder can be obtained.

Furthermore, the second land pattern 14 is preferably formed so that each divided region of the plurality of divided regions has the same area. This makes it possible to uniformly divide the bonding member 40 into each divided region of second land patterns 14. For example, the second land pattern 14 can be divided symmetrically with respect to a point.

Alternatively, the second land pattern 14 can include a divided central region 14b separated in an island shape at the center of the contour of the outer shape as in Examples 8 to 10 illustrated in FIGS. 22H to 22J. By providing the divided central region 14b at the center of the second land pattern 14 in this manner, the positioning member 30 is more stably fixed to the mounting substrate 10, and at the same time, the bonding strength can be ensured.

In addition, the divided concentric region 14c obtained by dividing the second land pattern 14 concentrically so as to surround the periphery of the divided central region 14b can be provided (FIGS. 22H to 22J above). With such a configuration, the inclination of the positioning member 30 can be further suppressed.

Furthermore, the width of the groove portion 15 can be different depending on the portion. For example, in Examples 8 to 10 illustrated in FIGS. 22H to 22J, sizes of groove widths are made different between a first groove portion 15a for separating the divided central region 14b and a concentrically divided concentric region 14c formed therearound, and a second groove portion 15b for dividing the divided concentric region 14c into a plurality of divided concentric subdivided regions 14d. Here, the first groove portion 15a is wider than the second groove portion 15b. By configuring the groove width to be wider, the flow suppression effect of the solder due to reducing the void and reducing the size of the second land pattern 14 after division can be obtained. On the other hand, by making the groove width narrow, the second land pattern 14 can be made relatively large and the physical bonding strength can be improved. Further, by providing the wide groove portion and the narrow groove portion as described above, it is possible to receive both advantages.

Resist Pattern 13

The surface of the mounting substrate 10 is covered with a resist pattern 13. A first land pattern 12 and a second land pattern 14 are provided in a region not covered with the resist pattern 13. The resist pattern 13 is formed of a member that repels the bonding member 40 such as solder. For example, as the resist pattern 13, an insulating material such as light reflective solder resist can be used.

Manufacturing Method for Light-Emitting Device

Figure 23:
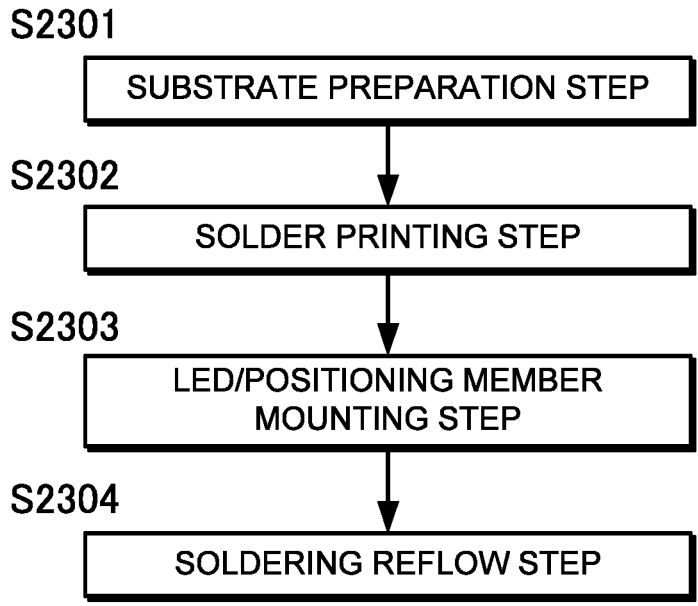
FIG. 23 is a process flow chart illustrating a method for manufacturing a light-emitting device according to the first embodiment.

A manufacturing method for the light-emitting device described above can include the following steps, as illustrated in FIG. 23.

First, in step S2301, the mounting substrate 10 is prepared. The first land pattern 12 and the second land pattern 14 are formed on the upper surface of the mounting substrate 10. The first land pattern 12 is a pattern for mounting the one or more light-emitting elements 11. Additionally, the second land pattern 14 is a pattern for fixing one surface of the positioning member 30, and is divided into a plurality of regions separated by the groove portion 15.

Subsequently, in step S2302, the bonding member 40 is disposed on the first land pattern 12 and the second land pattern 14. Solder can be used as the bonding member 40. The solder can be provided on the first land pattern 12 and the second land pattern 14 by printing. In the printing of solder, for example, solder paste is applied to the surface of the mounting substrate 10. The solder paste is not applied to the entire surface of the mounting substrate but is applied to the region of the first land pattern 12 for fixing the light-emitting element 11 and the region of the second land pattern 14 for disposing the positioning member 30. In this step, the height of the bonding member 40 can be adjusted by the amount of solder paste applied.

Next, in step S2303, the light-emitting element 11 and the positioning member 30 are disposed. Specifically, the one or more light-emitting elements 11 are mounted on the bonding member 40 disposed on the first land pattern 12 of the mounting substrate 10, and the electrode of the light-emitting element 11 is bonded to the bonding member 40 to temporarily fix the light-emitting element 11. On the other hand, the positioning member 30 is disposed on the bonding member 40 disposed on the second land pattern 14 of the mounting substrate 10.

Furthermore, in step S2304, the one or more light-emitting elements 11 and positioning member 30 are mounted by melting the bonding member 40. Here, this step of heating and melting the solder paste that bonds the light-emitting element 11 to solder the light-emitting element 11 to the fixed position of the mounting substrate 10 and melting and curing the solder paste applied to the second land pattern 14 to fix the positioning member 30 can be performed by a common reflow. Thus, the positioning member 30 can be collectively processed in an existing reflow process without separately providing a process for fixing the positioning member 30 to the mounting substrate 10, and the positioning member 30 can be fixed without increasing the number of manufacturing processes.

In this manner, the bonding member 40 for fixing the positioning member 30 to the mounting substrate 10 is dispersed by the second land pattern 14 divided into a plurality of regions, and as a result, the flow or deviation of the bonding member 40 is suppressed and the positioning accuracy is improved.

Comparative Test 1: Horizontal and Axial Direction

Figure 24:
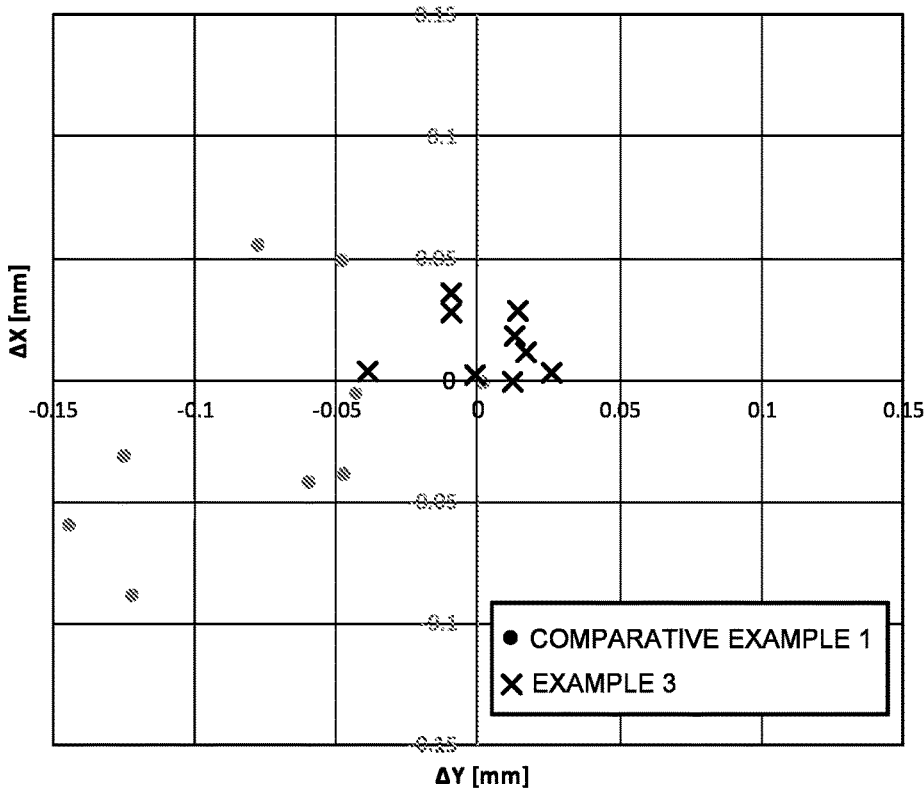
FIG. 24 is a graph illustrating positional accuracy of the positioning member according to a reflow process of the light-emitting device according to Comparative Example 1 and Example 3.

A light-emitting device using the second land pattern 14 of the light-emitting device according to Example 3 and a light-emitting device according to Comparative Example 1 were prototyped, and a result of examining the effect of suppressing the displacement of the positioning member 30 is shown in the graph of FIG. 24. Here, when the positioning pin as the positioning member 30 is fixed by reflow, the movement amounts of the positioning pin in the X direction and the Y direction before and after the reflow process are measured and plotted. The movement amount is considered to indicate a result obtained by adding the movement of the positioning pin in the horizontal direction and the positional deviation due to the inclination in the axial direction. The reflow was performed under the recommended condition of the solder used. The displacement amount of the positioning pin was measured using TR7500LSIII manufactured by TRI. Here, nine samples were prepared for each of Comparative Example 1 and Example 3, and the movement amounts of the positioning pin in the X direction and the Y direction for each sample were plotted on the graph as illustrated in FIG. 24. When the maximum values and the average values of the movement amounts in the X direction and the Y direction were calculated, the results illustrated in Table 1 were obtained. In Table 1, the followings are respectively illustrated:

$\Delta X$=[X-coordinate of pin position after reflow process]−[X-coordinate of pin position before reflow process];

$\Delta Y$=[Y coordinate of pin position after reflow process]−[Y coordinate of pin position before reflow process];

MAX: maximum movement amount, maximum value of $|\Delta X|$ or maximum value of $|\Delta Y|$; and AVE: average movement amount, average value of $|\Delta X|$ or average value of $|\Delta Y|$.

TABLE 1

| SAMPLE | COM. EX. 1 | | EX. 2 | |
| NO. | $\Delta X$ | $\Delta Y$ | $\Delta X$ | $\Delta Y$ |
| --- | --- | --- | --- | --- |
| No. 1 | −0.047 | −0.038 | −0.038 | 0.004 |
| No. 2 | −0.078 | 0.056 | 0.014 | 0.029 |
| No. 3 | −0.048 | 0.05 | 0.013 | 0.018 |
| No. 4 | 0.001 | 0 | −0.009 | 0.036 |
| No. 5 | −0.125 | −0.031 | 0.017 | 0.012 |
| No. 6 | −0.122 | −0.088 | −0.001 | 0.002 |
| No. 7 | −0.043 | −0.005 | −0.009 | 0.028 |
| No. 8 | −0.06 | −0.041 | 0.012 | 0 |
| No. 9 | −0.144 | −0.059 | 0.027 | 0.003 |
| MAX | 0.144 | 0.088 | 0.038 | 0.036 |
| AVE | 0.074 | 0.041 | 0.016 | 0.015 |

As illustrated in FIG. 24 and Table 1, while the displacement amount of the positioning pin was large in Comparative Example 1, the displacement amounts in both the X direction and the Y direction could be suppressed in Example 3, and the effect of suppressing the displacement amount of the positioning member 30 was found.

Comparative Test 2: Height Direction

Figure 25:
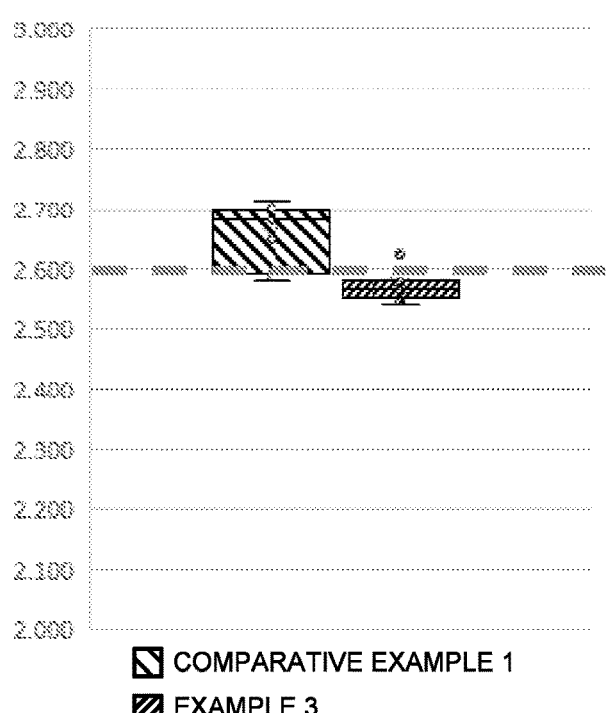
FIG. 25 is a graph showing a measurement result of accuracy in a height direction of the positioning member of the light-emitting device according to Comparative Example 1 and Example 3.

Also, a result of the measurement of the height direction of the positioning pin similarly is illustrated in FIGS. 25 and Table 2. Again, as in Comparative Test 1 described above, nine samples were prepared for each of Comparative Example 1 and Example 3, and the displacement amount in the height direction of each sample was measured and represented on a graph as shown in FIG. 25, as well as the displacement amount in the height direction of the sample, and the maximum value, the average value, the minimum value, and $3a$ thereof were calculated and listed in Table 2. The TR7500LSIII manufactured by TRI was used for the measurement. In Table 2, the following are listed:

Z: Pin height after mounting (reference height: upper surface of resist);

MAX: maximum value;

AVE: average value;

MIN: minimum value; and $3\sigma$: standard deviation×3. In Comparative Test 2, the design value is as follows:

1Design Value=Single Pin+Copper foil−Resist+Solder=2.60 [mm]. Each of the positioning pin, the copper foil, and the resist has a tolerance, and the coating amount of the solder serving as the bonding member 40 also has a variation.

TABLE 2

| SAMPLE NO. | COM. EX. 1 Z | EX. 3 Z |
| --- | --- | --- |
| No. 1 | 2.704 | 2.567 |
| No. 2 | 2.683 | 2.570 |
| No. 3 | 2.583 | 2.565 |
| No. 4 | 2.695 | 2.580 |
| No. 5 | 2.650 | 2.624 |
| No. 6 | 2.594 | 2.541 |
| No. 7 | 2.716 | 2.567 |
| No. 8 | 2.689 | 2.583 |
| No. 9 | 2.591 | 2.546 |
| MAX | 2.716 | 2.624 |
| AVE | 2.656 | 2.571 |
| MIN | 2.583 | 2.541 |
| $3\sigma$ | 0.160 | 0.072 |

As illustrated in FIG. 25 and Table 2, it was found that in Comparative Example 1, the standard deviation was large and the average value was also high, whereas in Example 3, the standard deviation was suppressed to half or less, the average value was also reduced, and the fluctuation of the positioning member 30 in the height direction was also suppressed. It is presumed that, by dividing the second land pattern 14, as illustrated in FIG. 17, the excessive solder moves to the region of the groove portion 15, the void in the solder is also reduced, and the height of the positioning member 30 is stabilized.

Comparative Test 3: Rotation Direction

Furthermore, variation in the rotation direction of the positioning pin was also measured. In particular, when the positioning member 30 is not a cylindrical shape as illustrated in FIG. 16 in which the contour does not change even when rotated about the central axis as a rotation axis but a prismatic shape or a pyramidal shape in which the contour changes due to rotation, the optical element assembly 20 cannot be fixed in a desired posture as a result of the rotation of the positioning member 30, so that it is important to suppress the rotation.

Figures 26, 27A, 27B, 27C, 27D:
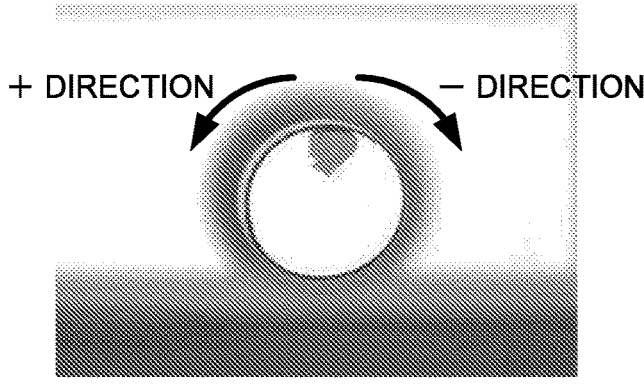
FIG. 26 is a photograph for observing the presence or absence of rotation of the positioning member before and after the reflow process.
FIG. 27A is a photograph of the positioning member of the light-emitting device according to Comparative Example 1 before the reflow process.
FIG. 27B is a photograph of the positioning member of the light-emitting device according to Comparative Example 1 after the reflow process.
FIG. 27C is a photograph of the positioning member of the light-emitting device according to Example 3 before the reflow process.
FIG. 27D is a photograph of the positioning member of the light-emitting device according to Example 3 after the reflow process.

Therefore, as Comparative Test 3, the light-emitting devices according to Comparative Example 1 and Example 3 were produced, and the rotation angle of the positioning member 30 was measured to examine the presence or absence of the rotational suppression effect. In Comparative Test 3, an image before and after reflow was acquired. Here, as illustrated in FIG. 26, plane photographs of the cylindrical positioning pin were taken before and after the reflow process, and the rotation angle θ was measured based on the images taken by VMZ R6555 manufactured by Nikon Corporation with the counterclockwise direction as the + direction and the clockwise direction as the – direction. The rotation angle θ was measured with reference to the copper foil which is the second land pattern 14 of the mounting substrate 10 and which does not change before and after the reflow process in the captured image. Here, photographs of the positioning member 30 taken before and after the reflow process in Comparative Example 1 and Example 3 are illustrated in FIGS. 27A to 27D. In these figures, FIG. 27A is a photograph of the positioning member 30 of the light-emitting device according to Comparative Example 1 before the reflow process, FIG. 27B is a photograph after the reflow process, FIG. 27C is a photograph of the positioning member 30 of the light-emitting device according to Example 3 before the reflow process, and FIG. 27D is a photograph after the reflow process.

Then, the two images are superimposed on each other in such a manner that the image after the reflow process is transmitted, and the image after the reflow process is rotated with reference to the mark provided in advance. Then, the degree of rotation of the image after the reflow process was measured, and the angle was defined as a rotation angle θ. In Comparative Test 3, the rotation angle θ was measured for six samples in Comparative Example 1 and nine samples in Example 3. The angle of rotation for each sample, and maximum value and average value thereof are illustrated in Table 3. In Table 3, θ represents the rotation angle after the reflow process with the rotation angle before the reflow process being 0°. MAX represents the maximum value of |θ|, and AVE represents the average value of |θ|.

TABLE 3

| SAMP. NO. | COM. EX. 1 | EX. 3 |
|---|---|---|
| 1 | −22 | 0 |
| 2 | −23 | 0 |
| 3 | −4 | 0 |

TABLE 3-continued

| SAMP. NO. | COM. EX. 1 | EX. 3 |
|---|---|---|
| 4 | 42 | 0 |
| 5 | −6 | 0 |
| 6 | 28 | 0 |
| 7 |  | 0 |
| 8 |  | 0 |
| 9 |  | 0 |
| MAX | 42 | 0 |
| AVE | 13.9 | 0.0 |

As illustrated in Table 3, in Comparative Example 1, the occurrence of rotation was found in all samples. It was found that at most 42 degrees of rotation occurred. On the other hand, in Example 3, the occurrence of rotation was not observed. From the above, it was found that by dividing the second land pattern 14, the movement of the solder melted in the reflow process was suppressed, and the rotation of the positioning member 30 was suppressed before and after the reflow process.

The light-emitting device and the manufacturing method for the light-emitting device according to the present invention can be suitably applied to a light-emitting device that refracts and diffuses or condenses light emitted from an LED by an optical element and emits the light to the outside in a predetermined light distribution pattern, for example, to a light source of a medium or large FPD exposure device, a lighting lamp or street lamp in a factory, a headlight of a vehicle, or the like.

It is to be understood that, although certain embodiments of the present invention have been described, various other embodiments and variants may occur to those skilled in the art that are within the scope and spirit of the invention, and such other embodiments and variants are intended to be covered by the following claims.

REFERENCE SIGNS LIST

100, 300, 400, 500, 600, 700, 800, 900, 1000, 1100 Light-emitting device
10 Mounting substrate
11, 11C, 11D, 11E, 11F, 11G, 11H Light-emitting element
12 First land pattern
13 Resist pattern
14 Second land pattern; 14b Divided central region;
14c Divided concentric region; 14d Divided concentric subdivided region
15 Groove portion; 15a First groove portion; 15b Second groove portion
20, 20C, 20D, 20E, 20F, 20G, 20H Optical element assembly
21, 21C, 21D, 21E, 21F, 21G, 21H Optical element
22 Positioning receiving portion; 22A Hole portion; 22I Recess; 22K Rectangular hole
30 Positioning member; 30K Rectangular column
31 Bonding surface
40 Bonding member
913 Resist pattern
914 Second land pattern
916 Opening
930 Positioning pin
940 Solder

What is claimed is:

1. A light-emitting device comprising:
one or more light-emitting elements having a first optical axis;

a mounting substrate on which the one or more light-emitting elements are placed on a first land pattern that is made of electrically conductive material and forms a part of a conductive path for electrical connection;

one or more optical elements having a second optical axis and configured to emit light emitted by the one or more light-emitting elements to an outside;

a positioning member made of metal and physically connecting the mounting substrate and one or more optical elements, the positioning member being configured to define a relative position between the one or more optical elements and the one or more light-emitting elements such that the second optical axis of the one or more optical elements and the first optical axis of the one or more light-emitting elements are aligned with each other by physically connecting the mounting substrate and one or more optical elements;

a second land pattern formed on the mounting substrate and configured to fix one surface of the positioning member, the second land pattern interposed between the positioning member and the mounting substrate;

a bonding member configured to fix the second land pattern and the positioning member to each other, wherein the second land pattern is divided into a plurality of regions separated by a groove portion;

wherein the positioning member has a columnar shape extending for a longer distance than a diameter of a circumscribed circle of the one surface fixed to the mounting substrate; and wherein the second land pattern is formed in a contour corresponding to a contour of the one surface of the positioning member.

2. The light-emitting device according to claim 1, wherein the one or more optical elements include a positioning receiving portion corresponding to the positioning member.

3. The light-emitting device according to claim 2, wherein the positioning receiving portion is a hole portion into which the positioning member is inserted.

4. The light-emitting device according to claim 1, wherein the positioning member has a cylindrical shape or a prismatic shape.

5. The light-emitting device according to claim 1, wherein the positioning member has a conical shape or a pyramid shape.

6. The light-emitting device according to claim 1, wherein the groove portion divides the second land pattern at a position where the groove portion passes through a center of the second land pattern.

7. The light-emitting device according to claim 1, wherein the second land pattern is divided such that each of the plurality of divided regions has a same area.

8. The light-emitting device according to claim 1, wherein the second land pattern includes a region separated into an island shape at a center of the second land pattern.

9. The light-emitting device according to claim 1, wherein the second land pattern is divided symmetrically with respect to a point.

10. The light-emitting device according to claim 1, wherein the second land pattern is divided into three or more regions.

11. The light-emitting device according to claim 1, wherein the one or more light-emitting elements are a plurality of light-emitting elements, and the one or more optical elements correspond to an optical element assembly including a plurality of optical elements.

12. The light-emitting device according to claim 11, wherein the optical element assembly is a microlens array in which microlenses are connected.

* * * * *